(12) United States Patent
Kim

(10) Patent No.: US 11,481,272 B2
(45) Date of Patent: Oct. 25, 2022

(54) MEMORY CONTROLLER AND METHOD OF OPERATING THE SAME

(71) Applicant: SK hynix Inc., Gyeonggi-do (KR)

(72) Inventor: Ki Young Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 167 days.

(21) Appl. No.: 16/945,068

(22) Filed: Jul. 31, 2020

(65) Prior Publication Data

US 2021/0279132 A1 Sep. 9, 2021

(30) Foreign Application Priority Data

Mar. 9, 2020 (KR) .................... 10-2020-0029236

(51) Int. Cl.
| | |
|---|---|
| *G06F 11/00* | (2006.01) |
| *G06F 11/10* | (2006.01) |
| *G06F 11/16* | (2006.01) |
| *G06F 11/07* | (2006.01) |
| *G06F 12/02* | (2006.01) |
| *G06F 12/0882* | (2016.01) |
| *G06F 11/30* | (2006.01) |

(52) U.S. Cl.
CPC ....... *G06F 11/1068* (2013.01); *G06F 11/0772* (2013.01); *G06F 11/1666* (2013.01); *G06F 11/3037* (2013.01); *G06F 12/0246* (2013.01); *G06F 12/0882* (2013.01); *G06F 2212/7205* (2013.01)

(58) Field of Classification Search
CPC ............ G06F 11/1068; G06F 11/0772; G06F 11/1666; G06F 11/3037; G06F 11/0727; G06F 11/2053; G06F 12/0246; G06F 12/0882; G06F 2212/7205
See application file for complete search history.

(56) References Cited

U.S. PATENT DOCUMENTS

| | | | |
|---|---|---|---|
| 9,646,721 B1 * | 5/2017 | Michaud | G11C 16/20 |
| 10,310,924 B2 * | 6/2019 | Jei | G06F 11/102 |
| 2016/0163397 A1 * | 6/2016 | Sehgal | G11C 16/26 |
| | | | 365/185.09 |
| 2016/0180959 A1 * | 6/2016 | Darragh | G06F 11/073 |
| | | | 365/185.09 |
| 2018/0165022 A1 * | 6/2018 | Tomic | G06F 11/1004 |
| 2019/0258422 A1 * | 8/2019 | Purkayastha | G06F 3/0608 |
| 2020/0034223 A1 * | 1/2020 | Rori | G06F 12/0246 |
| 2020/0042208 A1 * | 2/2020 | Roberts | G06F 3/0605 |
| 2021/0173558 A1 * | 6/2021 | Kashyap | G06F 3/0652 |

FOREIGN PATENT DOCUMENTS

| | | |
|---|---|---|
| KR | 10-2013-0078973 | 7/2013 |
| KR | 10-2015-0133913 | 12/2015 |
| KR | 10-2015053 | 8/2019 |

* cited by examiner

*Primary Examiner* — Joseph D Manoskey
(74) *Attorney, Agent, or Firm* — IP & T Group LLP

(57) ABSTRACT

The present technology relates to an electronic device. A memory controller controls a memory device such that a life of the memory device is increased. The memory controller that controls the memory device includes a flash translation layer configured to generate a device health descriptor based on device information received from the memory device, and a bad block controller configured to generate a bad block table based on bad block information received from the memory device, and generate recycling information for recycling pages in bad blocks recorded in the bad block table based on the device health descriptor.

16 Claims, 26 Drawing Sheets

| DHD (DEVICE HEALTH DESCRIPTOR) |||
|---|---|---|
| bPreEOLInfo | bDeviceLifeTimeEstA | dRefreshTotalCount |
| 02h | 04h | 25h |

FIG. 11

| #BLOCK | #CHANNEL | #PLANE | #PAGE |
|--------|----------|--------|-------|
| 12 | 1 | 1 | 12_4 |
| 13 | 1 | 1 | 13_4 |
| 21 | 2 | 2 | 21_2 |
| 22 | 2 | 2 | 22_2 |
| 32 | 3 | 3 | 32_4 |
| 33 | 3 | 3 | 33_4 |
| 41 | 4 | 4 | 41_2 |

FIG. 12

| PLANE1 | PLANE2 | PLANE3 | PLANE4 |
|---|---|---|---|
| PAGE11_1 | PAGE21_1 | PAGE31_1 | PAGE41_1 |
| PAGE11_2 | PAGE21_2 | PAGE31_2 | PAGE41_2 |
| PAGE11_3 | PAGE21_3 | PAGE31_3 | PAGE41_3 |
| PAGE11_4 | PAGE21_4 | PAGE31_4 | PAGE41_4 |
| PAGE11_5 | PAGE21_5 | PAGE31_5 | PAGE41_5 |
| PAGE11_6 | PAGE21_6 | PAGE31_6 | PAGE41_6 |
| PAGE12_1 | PAGE22_1 | PAGE32_1 | PAGE42_1 |
| PAGE12_2 | PAGE22_2 | PAGE32_2 | PAGE42_2 |
| PAGE12_3 | PAGE22_3 | PAGE32_3 | PAGE42_3 |
| PAGE12_4 | PAGE22_4 | PAGE32_4 | PAGE42_4 |
| PAGE12_5 | PAGE22_5 | PAGE32_5 | PAGE42_5 |
| PAGE12_6 | PAGE22_6 | PAGE32_6 | PAGE42_6 |
| PAGE13_1 | PAGE23_1 | PAGE33_1 | PAGE43_1 |
| PAGE13_2 | PAGE23_2 | PAGE33_2 | PAGE43_2 |
| PAGE13_3 | PAGE23_3 | PAGE33_3 | PAGE43_3 |
| PAGE13_4 | PAGE23_4 | PAGE33_4 | PAGE43_4 |
| PAGE13_5 | PAGE23_5 | PAGE33_5 | PAGE43_5 |
| PAGE13_6 | PAGE23_6 | PAGE33_6 | PAGE43_6 |
| ⋮ | ⋮ | ⋮ | ⋮ |

FIG. 17

| PLANE1 | PLANE2 | PLANE3 | PLANE4 |
|---|---|---|---|
| – | – | – | – |
| – | PAGE21_2 | – | PAGE41_2 |
| – | – | – | – |
| PAGE11_4 | PAGE21_4 | PAGE31_4 | PAGE41_4 |
| PAGE11_5 | PAGE21_5 | PAGE31_5 | PAGE41_5 |
| PAGE11_6 | PAGE21_6 | PAGE31_6 | PAGE41_6 |
| – | – | – | PAGE42_1 |
| – | PAGE22_2 | – | PAGE42_2 |
| – | – | – | – |
| PAGE12_4 | – | PAGE32_4 | – |
| – | – | – | – |
| PAGE12_6 | PAGE22_6 | PAGE32_6 | PAGE42_6 |
| PAGE13_1 | PAGE23_1 | PAGE33_1 | PAGE43_1 |
| PAGE13_2 | PAGE23_2 | PAGE33_2 | PAGE43_2 |
| – | – | – | – |
| PAGE13_4 | – | PAGE33_4 | – |
| – | – | – | – |
| PAGE13_6 | PAGE23_6 | PAGE33_6 | PAGE43_6 |
| ⋮ | ⋮ | ⋮ | ⋮ |

MEMORY CONTROLLER AND METHOD OF OPERATING THE SAME

CROSS-REFERENCE TO RELATED APPLICATION

The present application claims priority under 35 U.S.C. § 119(a) to Korean patent application number 10-2020-0029236, filed on Mar. 9, 2020, which is incorporated herein by reference in its entirety.

BACKGROUND

Field of Invention

The present disclosure relates to an electronic device, and more particularly, to a memory controller and a method of operating the same.

Description of Related Art

A storage device stores data under control of a host device such as a computer, a smart phone, or a smart pad. The storage device may be of a type that stores data in a magnetic disk such as a hard disk drive (HDD), or of a type that stores data in a semiconductor memory, such as a solid state drive (SSD) or a memory card, in particular, a non-volatile memory.

A storage device may include a memory device in which data is stored and a memory controller that stores data in the memory device. A memory device may be a volatile memory or a non-volatile memory. Examples of a non-volatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

SUMMARY

An embodiment of the present disclosure provides a memory controller and a method of operating the same, which controls a memory device to recycle a bad block according to information included in a device descriptor, in order to increase life of the memory device.

A memory controller according to an embodiment of the present disclosure controls a memory device. The memory controller may include a flash translation layer configured to generate a device health descriptor based on device information received from the memory device, and a bad block controller configured to generate a bad block table based on bad block information received from the memory device, and generate recycling information for recycling pages in bad blocks recorded in the bad block table based on the device health descriptor.

A method of operating a memory controller according to an embodiment of the present disclosure is a method of operating a memory controller that controls a memory device. The method may include receiving device information from the memory device, generating a device health descriptor based on the device information, and determining whether to recycle pages in bad blocks in the memory device based on the device health descriptor.

A method of operating a memory controller according to an embodiment of the present disclosure is a method of operating a memory controller. The method may include receiving first and second items of information from a memory device, controlling, depending on the first item of information, the memory device to perform an operation on a valid page within a bad block selected on a basis of the second item of information, wherein the first item of information indicates a level regarding remaining life of the memory device, and wherein the second item of information indicates one or more valid pages in each bad block within the memory device.

According to embodiments of the present invention, life of the memory device may be extended by recycling the bad block.

BRIEF DESCRIPTION OF THE DRAWINGS

FIG. 11 is a diagram illustrating a bad block table.

FIG. 12 is a diagram illustrating an embodiment in which a bad block is generated.

FIG. 17 is a diagram for describing recycled pages when recycling bad blocks in first to fourth planes.

DETAILED DESCRIPTION

Specific structural and functional description provided herein is directed to embodiments of the present invention. However, features and aspects of the present invention may be configured and/or carried out in various other ways. Thus, the present invention is not limited to or by any of the disclosed embodiments nor to or by any particular detail described herein. Also, throughout the specification, reference to "an embodiment," "another embodiment" or the like is not necessarily to only one embodiment, and different references to any such phrase are not necessarily to the same embodiment(s).

Figure 1:
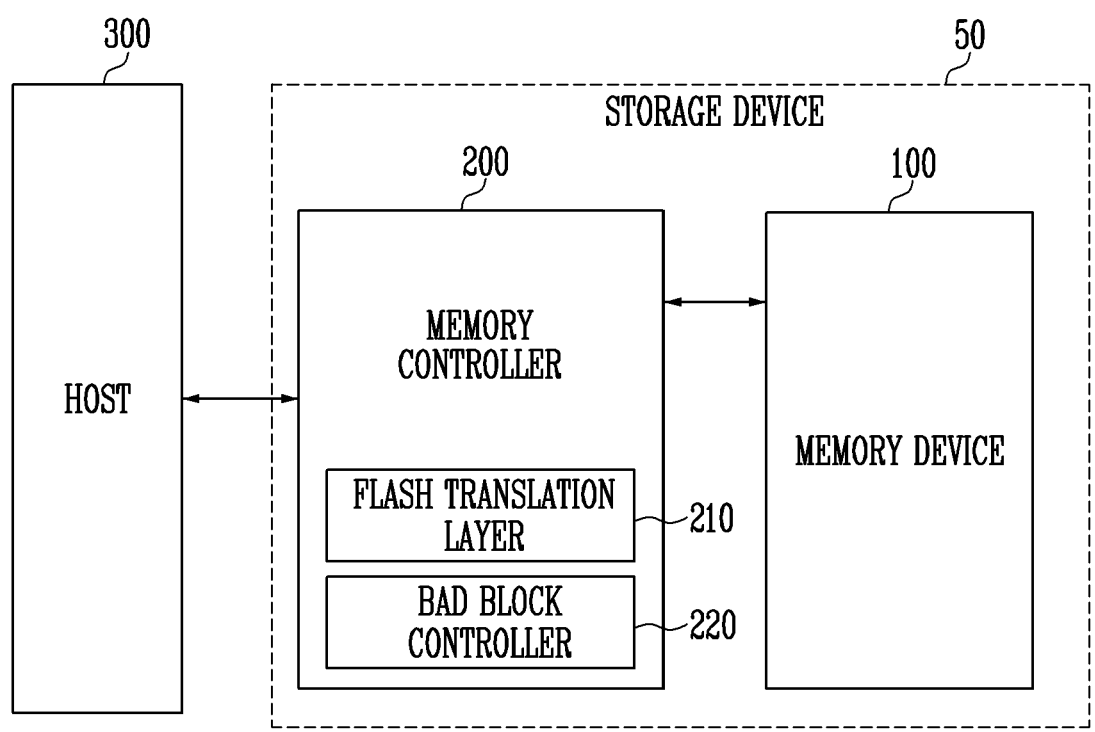
FIG. 1 is a block diagram illustrating a storage device.

FIG. 1 is a block diagram illustrating a storage device.

Referring to FIG. 1, the storage device 50 may include a memory device 100 and a memory controller 200.

The storage device 50 may store data under control of a host 300 such as a cellular phone, a smartphone, an MP3 player, a laptop computer, a desktop computer, a game player, a TV, a tablet PC, or an in-vehicle infotainment system.

The storage device 50 may be configured as any of various types of storage devices according to a host interface that is a communication method with the host 300. For example, the storage device 50 may be any of an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any of various types of packages. For example, the storage device 50 may be manufactured as any of a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, by way of example, features and aspects of the invention are described in the context in which the memory device 100 is a NAND flash memory.

The memory device 100 may be implemented as a two-dimensional array structure or a three-dimensional array structure. Hereinafter, the three-dimensional array structure is described as an embodiment, but the present invention is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access a region selected by the address in the memory cell array. That is, the memory device 100 may perform an operation corresponding to the command on the region selected by the address. For example, the memory device 100 may perform a write operation (program operation), a read operation, or an erase operation according to the received command. For example, when a program command is received, the memory device 100 may program data to the region selected by the address. When a read command is received, the memory device 100 may read data from the region selected by the address. When an erase command is received, the memory device 100 may erase data stored in the region selected by the address.

The memory controller 200 may control overall operation of the storage device 50.

When a power voltage is applied to the storage device 50, the memory controller 200 may execute firmware. When the memory device 100 is a flash memory device 100, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data in the memory device 100 is to be stored. In addition, the memory controller 200 may store a logical-physical address mapping table configuring a mapping relationship between the LBA and the PBA in a buffer memory.

The memory controller 200 may control the memory device 100 to perform a program operation, a read operation, an erase operation, or the like according to a request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit a program command, address, and data to the memory device 100 without a corresponding request from the host 300. For example, the memory controller 200 may autonomously provide a command, an address, and data to the memory device 100 so as to perform any of various background operations such as a wear leveling operation and a garbage collection operation.

The memory controller 200 may include a flash translation layer 210. The flash translation layer 210 may receive device information from the memory device 100. The device information may include information on the number of times each of a program operation and an erase operation has been performed on the memory device 100, the number of reserved blocks in the memory device 100, and the number of times a refresh operation has been performed on the memory device 100. Device information is not limited to the information described above; various other information may be included in the device information. The device information may be output to the memory controller 200 when a state of the memory device 100 is changed or when a background operation is performed. In another embodiment, the device information may be output from the memory device 100 in response to a request of the memory controller 200.

In an embodiment, after receiving the device information from the memory device 100, the flash translation layer 210 may generate a device health descriptor (DEVICE HEALTH DESCRIPTOR (DHD)) based on the device information. The DHD may include a plurality of fields.

For example, the DHD may be configured of a field indicating a size of the DHD, a field indicating life of the memory device determined based on the number of reserved blocks, a field indicating the life of the memory device determined according to a program/erase period, and a field indicating the number of times the refresh operation has been performed. The DHD is not limited to the fields presented above; other information/fields may be included in the DHD.

The flash translation layer 210 may generate the DHD based on the device information, and then provide the generated DHD to a bad block controller 220.

The memory controller 200 may include the bad block controller 220. The bad block controller 220 may determine whether to recycle bad blocks in the memory device 100 based on the DHD received from the flash translation layer 210.

Specifically, according to a field value generated based on the number of remaining reserved blocks among the fields in the DHD, it may be determined whether to recycle the bad blocks in the memory device 100.

For example, when the life of the memory device determined based on a specific field of the DHD is a normal level or a warning level, the bad block controller 220 may determine not to recycle the bad blocks. Each of the normal level and the warning level may be determined based on the number of remaining reserved blocks in the memory device 100.

However, when the life of the memory device determined based on the specific field of the DHD is a critical level, the bad block controller 220 may determine to recycle the bad blocks. The critical level may be determined based on the number of remaining reserved blocks in the memory device 100.

When the bad block controller 220 determines to recycle the bad blocks, the bad block controller 220 may determine or identify recycled pages among pages in the bad blocks based on bad block information received from the memory device 100. Thereafter, a write operation or movement of data may be performed on the recycled page(s).

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and/or a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (GDDR) SDRAM, a low power DDR (LPDDR), or Rambus dynamic random access memory (RDRAM), or a static random access memory (SRAM).

In various embodiments, the buffer memory may be external to the storage device 50. In this case, one or more volatile memory devices connected to the storage device 50 may serve as the buffer memory.

In an embodiment, the memory controller 200 may control two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and/or a load reduced DIMM (LRDIMM).

Figure 2:
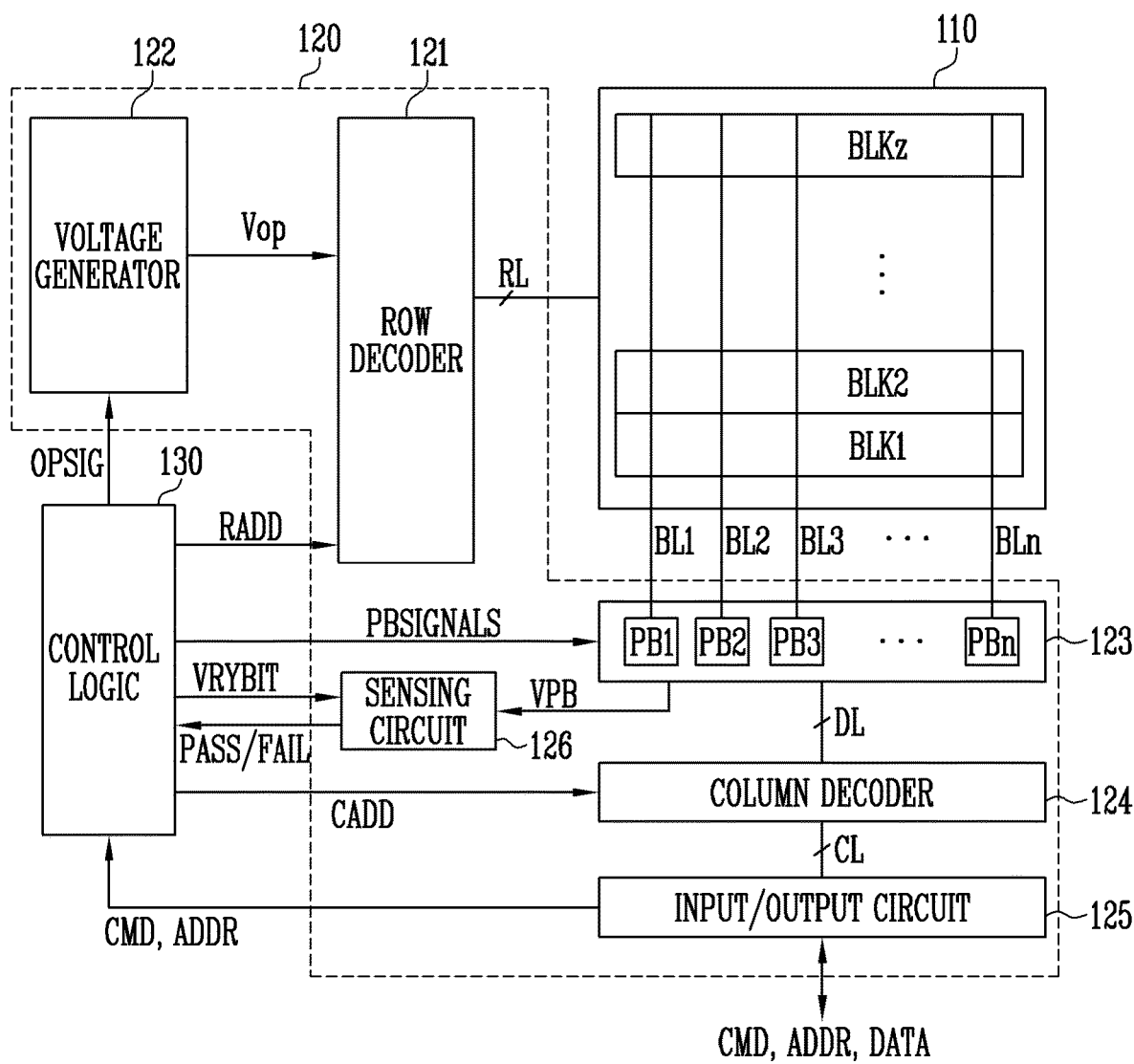
FIG. 2 is diagram illustrating a structure of a memory device, such as that of FIG. 1.

FIG. 2 is diagram illustrating a structure of the memory device of FIG. 1.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. In an embodiment, the plurality of memory cells are non-volatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a single level cell (SLC) that stores one data bit, a multi-level cell (MLC) that stores two data bits, a triple level cell (TLC) that stores three data bits, or a quadruple level cell (QLC) that stores four data bits.

The peripheral circuit 120 may be configured to perform a program operation, a read operation, or an erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to operation signal OPSIG. For example, the voltage generator 122 may generate the program voltage, the verify voltage, the pass voltage, the read voltage, the erase voltage, and the like in response to the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to n-th page buffers PB1 to PBn, which are connected to the memory cell array 110 through the first to n-th bit lines BL1 to BLn, respectively. The first to n-th page buffers PB1 to PBn operate in response to the control of the control logic 130. Specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

Specifically, during the program operation, when the program voltage is applied to the selected word line, the first to n-th page buffers PB1 to PBn may transfer data DATA received through the input/output circuit 125 to the selected memory cell through the first to n-th bit lines BL1 to BLn. The memory cells of the selected page are programmed according to the transferred data DATA. During the program verify operation, the first to n-th page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under the control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit signal VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation has passed or failed in response to the pass or fail signal PASS or FAIL.

The memory cells included in the memory cell array 110 may be programmed to any one of a plurality of program states according to data stored in each memory cell. A target program state of the memory cell may be determined as any one of the plurality of program states according to data to be stored.

Figure 3:
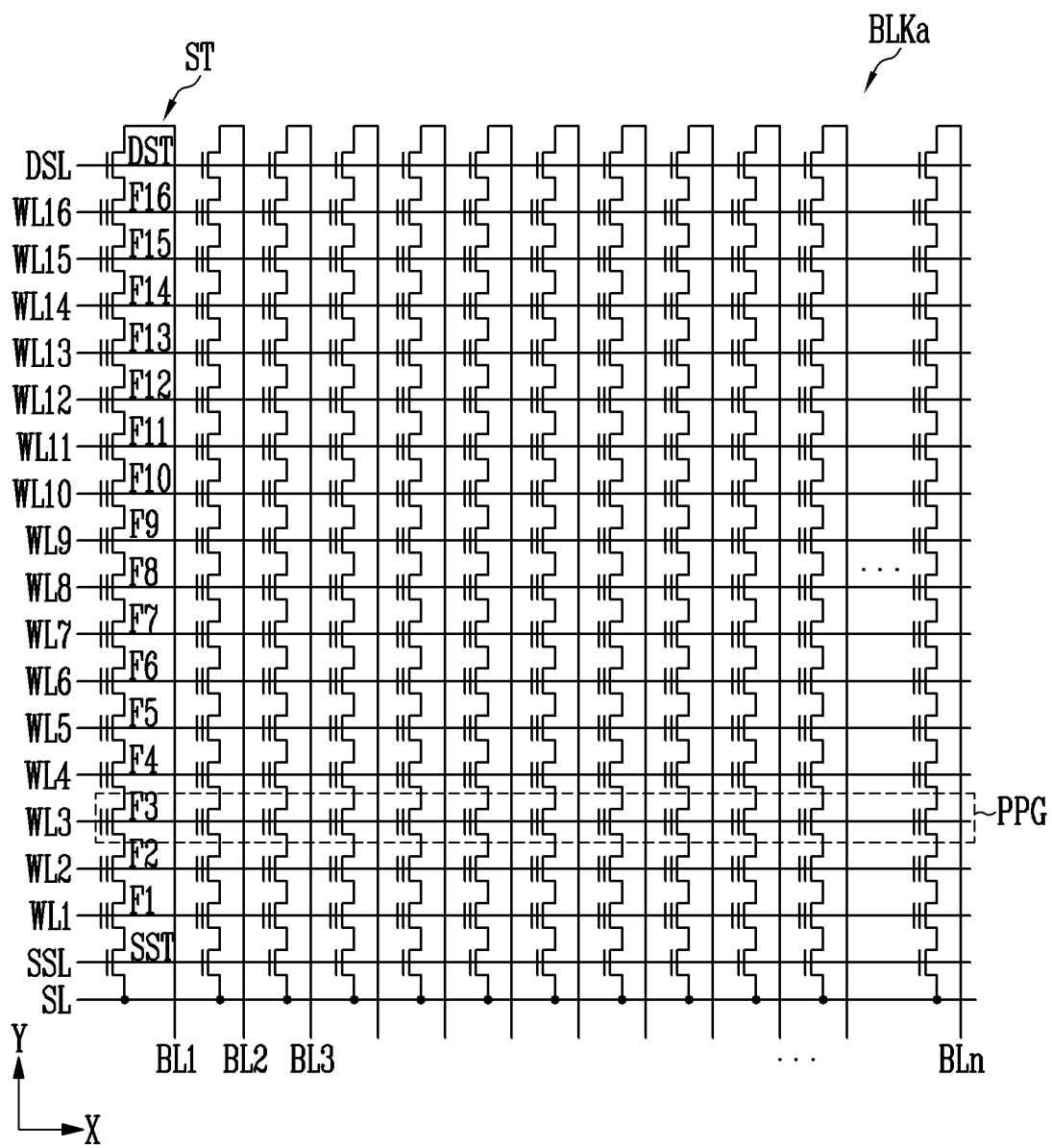
FIG. 3 is a diagram illustrating an embodiment of a memory cell array, such as that of FIG. 2.

FIG. 3 is a diagram illustrating an embodiment of the memory cell array of FIG. 2.

FIG. 3 is a circuit diagram showing a representative memory block BLKa among the plurality of memory blocks BLK1 to BLKz in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

More specifically, the memory block BLKa may include a plurality of strings connected between the bit lines BL1 to BLn and a source line SL. The bit lines BL1 to BLn may be connected to the strings, respectively, and the source line SL may be commonly connected to the strings. Since each of the strings may be configured the same, a string ST connected to the first bit line BL1 is specifically described as an example.

The string ST may include a source select transistor SST, a plurality of memory cells F1 to F16, and a drain select transistor DST connected in series between the source line SL and the first bit line BL1. One string ST may include one or more of the source select transistor SST and the drain select transistor DST, and may include more than the 16 memory cells F1 to F16 shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the same number of physical pages PPG as word lines WL1 to WL16.

One memory cell may store one bit of data. This is commonly referred to as a single level cell (SLC). In this case, one physical page PPG may store one logical page (LPG) data. One logical page (LPG) data may include the same number of data bits as there are memory cells in one physical page PPG. In addition, one memory cell may store two or more bits of data. This is commonly referred to as a multi-level cell (MLC). In this case, one physical page PPG may store two or more logical page (LPG) data.

A memory cell in which two or more bits of data are stored in one memory cell is referred to as a multi-level cell (MLC), but recently, as the number of bits of data stored in one memory cell has increased, the multi-level cell (MLC) in a more specific sense refers to a memory cell in which two bits of data is stored. In this case, a memory cell in which three bits of data are stored is referred to as a triple level cell (TLC), and a memory cell in which four bits of data are stored is referred to as a quadruple level cell (QLC). In addition, a memory cell method in which more than four bits of data are stored has been developed. Thus, more generally, the present invention may be applied to the memory device 100 in which two or more bits of data are stored.

In another embodiment, the memory block may have a three-dimensional structure. Each memory block includes a plurality of memory cells stacked on a substrate. Such plurality of memory cells are arranged along a +X direction, a +Y direction, and a +Z direction.

Figures 4, 5:
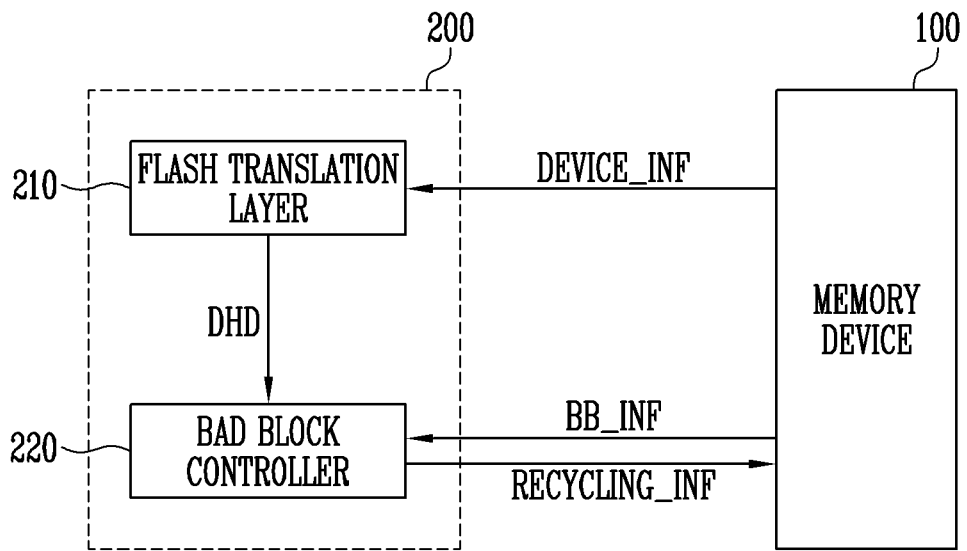
FIG. 4 is a diagram illustrating a configuration of a memory controller, such as that of FIG. 1.
FIG. 5 is a diagram for describing a device health descriptor output from a flash translation layer, such as that of FIG. 1.

FIG. 4 is a diagram illustrating a configuration of the memory controller of FIG. 1.

Referring to FIG. 4, the memory controller 200 may include the flash translation layer 210 and the bad block controller 220.

In an embodiment, the flash translation layer 210 may receive device information DEVICE_INF from the memory device 100. The device information DEVICE_INF may include information on the number of times each of a program operation and an erase operation has been performed on the memory device 100, the number of reserved blocks included in the memory device 100, and the number of times a refresh operation has been performed on the memory device 100. Device information DEVICE_INF may include other information as well.

In an embodiment, the device information DEVICE_INF may be generated at set intervals, e.g., periodically, or may be output from the memory device 100 in response to a request from the memory controller 200. Alternatively, when a state of the memory device 100 is changed from a busy state to a ready state, or when the state of the memory device 100 is changed from a non-idle state to the idle state, the device information DEVICE_INF may be generated.

In another embodiment, the device information DEVICE_INF may be generated during a background operation of the memory device 100.

In an embodiment, the flash translation layer 210 may generate the device health descriptor DHD based on the device information DEVICE_INF. The DHD may be configured of a plurality of fields. Each field may include various information.

For example, the DHD may include a field including content related to the life of the memory device 100 and a field including content related to the number of times the refresh operation has been performed. The information content of each field initially may be represented by a default value, which of each may be changed according to the device information DEVICE_INF received from the memory device 100.

In an embodiment, the flash translation layer 210 may generate the device health descriptor DHD (or updated value(s) thereof) whenever the flash translation layer 210 receives the device information DEVICE_INF from the memory device 100. That is, when receiving information indicating that the state of the memory device 100 changed, the DHD may be generated based on the changed state of the memory device 100. The generated DHD may be provided to the bad block controller 220.

In an embodiment, the bad block controller 220 may receive bad block information BB_INF from the memory device 100. The bad block information BB_INF may include information on a run-time bad block (RTBB) generated during an operation of the memory device 100.

For example, the bad block information BB_INF may include information on a number of a page in which the operation failed, a number of a memory block including a corresponding fail page, a number of a plane including a corresponding memory block, and a number of a channel connecting a die including a corresponding plane and the memory controller 200. The failed operation may be the program operation, the read operation, or the erase operation. In addition to the information described above, the bad block information BB_INF may include various other information on bad blocks.

When the bad block controller 220 receives the bad block information BB_INF, a bad block table may be generated based on the received bad block information BB_INF.

The bad block table is described in more detail with reference to FIG. 11.

The bad block controller 220 may generate recycling information RECYCLING_INF based on the DHD received from the flash translation layer 210 and the bad block information BB_INF received from the memory device 100.

In an embodiment, the bad block controller 220 may generate the recycling information RECYCLING_INF based on information on the DHD.

Specifically, the bad block controller 220 may generate the recycling information RECYCLING_INF based on a value of the field indicating the life of the memory device 100 among the fields in the DHD. The value indicating the life of the memory device 100 may be determined based on the number of remaining reserved blocks in the memory device 100.

For example, when the value indicating the life of the memory device 100 indicates the critical level, the bad block controller 220 may generate the recycling information RECYCLING_INF. Conversely, when the value indicating the life of the memory device 100 indicates the normal level or the warning level, the bad block controller 220 may not generate the recycling information RECYCLING_INF.

That is, the recycling information RECYCLING_INF may be generated when the life of the memory device 100 is at a critical level but not at a normal level or a warning level. Therefore, when the life of the memory device 100 is at the critical level, the pages in the bad block may be recycled according to the recycling information RECYCLING_INF, and when the life of the memory device 100 is at the normal level or the warning level, the pages in the bad block may not be recycled.

As a result, since the pages in the bad block are recycled when the life of the memory device 100 is at the critical level, the life of the memory device 100 may be extended. That is, since the program operation is performed on the pages in the bad block when the life of the memory device 100 is at the critical level, the life of the memory device 100 may be extended.

In an embodiment, the bad block controller 220 may generate the recycling information RECYCLING_INF based on the bad block information BB_INF received from the memory device 100. Specifically, the recycling information RECYCLING_INF may be generated with reference to the bad block table generated based on the bad block information BB_INF.

For example, when the fail page in the bad block is determined with reference to the bad block table, information on the remaining pages (excluding the fail page in the bad block and pages adjacent to the fail page) may be generated. That is, the recycling information RECYCLING_INF may include information on recycled pages, as information on the remaining pages, i.e., all pages except the page in which the operation failed and the pages adjacent to the fail pages, among the pages in the bad block.

In an embodiment, the bad block controller 220 may output the recycling information RECYCLING_INF to the memory device 100. Furthermore, the memory controller 200 may instruct performance of the program operation on the pages in the recycling information RECYCLING_INF based on the recycling information RECYCLING_INF.

Thereafter, when the memory device 100 performs the program operation, such operation is performed on the pages in the recycling information RECYCLING_INF based on the recycling information RECYCLING_INF. Therefore, the life of the memory device 100 may be extended by recycling the pages in the bad block.

FIG. 5 is a diagram for describing the device health descriptor output from the flash translation layer.

FIG. 5 shows, as an example, fields included in the device health descriptor DHD. A first row of the DHD shows a name of each field, and a second row shows a default value corresponding to each field.

In FIG. 5, the number of fields included in the DHD is three, but the present invention is not limited in this regard; that is, the number of fields may be more than three fields.

In an embodiment, the first field bPreEOLInfo included in the DHD may indicate the life of the memory device 100. The value of the first field bPreEOLInfo may be determined based on the number of remaining reserved blocks in the memory device 100. That is, a value corresponding to the first field bPreEOLInfo may indicate the life of the memory device 100 determined based on the number of remaining reserved blocks.

In an embodiment, the value corresponding to the first field bPreEOLInfo may be any one of '01h', '02h', and '03h'. When the value of the first field bPreEOLInfo is '01h', a remaining life of the memory device 100 may be at the normal level, when the value of the first field bPreEOLInfo is '02h', the remaining life of the memory device 100 may be at the warning level, and when the value corresponding to the first field bPreEOLInfo is '03h', the remaining life of the memory device 100 may be at the critical level.

Here, the normal level may mean that less than 80% of all reserved blocks in the memory device 100 are used reserved blocks. Furthermore, the warning level means that 80% or more and less than 90% of all reserved blocks are used, and the critical level means that 90% or more of all reserved blocks are used. That is, as the number of used reserved blocks among all reserved blocks increases, the remaining life of the memory device 100 may approach the critical level, and as the number of used reserved blocks decreases from above the normal level, the remaining life of the memory device 100 may approach the normal level.

In FIG. 5, since the value of the first field bPreEOLInfo is '02h', which is a default value, the life of the memory device 100, as determined based on the number of remaining reserved blocks, may be at the warning level. Thereafter, according to the device information DEVICE_INF received from the memory device 100, the value of the first field bPreEOLInfo may be changed from '02h' to '01h' or from '02h' to '03h', or may remain unchanged.

In an embodiment, the second field bDeviceLifeTimeEstA in the device health descriptor DHD may be another field indicating the life of the memory device 100. However, differently from the first field bPreEOLInfo, the value of the second field bDeviceLifeTimeEstA may indicate the remaining life of the memory device 100, as determined based on the number of times the program/erase operation is performed. That is, a value of the second field bDeviceLifeTimeEstA may indicate the remaining life of the memory device 100 determined based on the number of times the program/erase operation is performed.

The value corresponding to the second field bDeviceLifeTimeEstA may be any one of '01h' to '0Ah'. When such value is '01h', the remaining life of the memory device 100 may be 90% to 100%, when such value is '02h', the remaining life of the memory device 100 may be 80% to 90%, when such value is '03h', the remaining life of the memory device 100 may be 70% to 80%, when such value is '04h', the remaining life of the memory device 100 may be 60% to 70%, when such value is '05h', the remaining life of the memory device 100 may be 50% to 60%, when such value is '06h', the remaining life of the memory device 100 may be 40% to 50%, when such value is '07h', the remaining life of the memory device 100 may be 30% to 40%, when such value is '08h', the remaining life of the memory device 100 may be 20% to 30%, when such value is '09h', the remaining life of the memory device 100 may be 10% to 20%, and when such value is '0Ah', the remaining life of the memory device 100 may be 0% to 10%.

In FIG. 5, since the value of the second field bDeviceLifeTimeEstA is '04h', the remaining life of the memory device 100, as determined based on the number of times the program/erase operation is performed, may be 60% to 70%; thus, '04h' may indicate that 60% to 70% of the total life of the memory device 100 remains. Thereafter, according to the device information DEVICE_INF received from the memory device 100, the value of the second field bDeviceLifeTimeEstA may be changed from '04h' to another value, or may remain unchanged.

In an embodiment, a third field dRefreshTotalCount included in the device health descriptor DHD may indicate the number of times the refresh operation has been performed on the memory device 100. Whenever the refresh operation is performed, a value corresponding to the third field dRefreshTotalCount may be increased by '1'.

In FIG. 5, '25h', as the dRefreshTotalCount value, represents the total number of times the refresh operation has been performed on the memory device 100.

Figure 6:
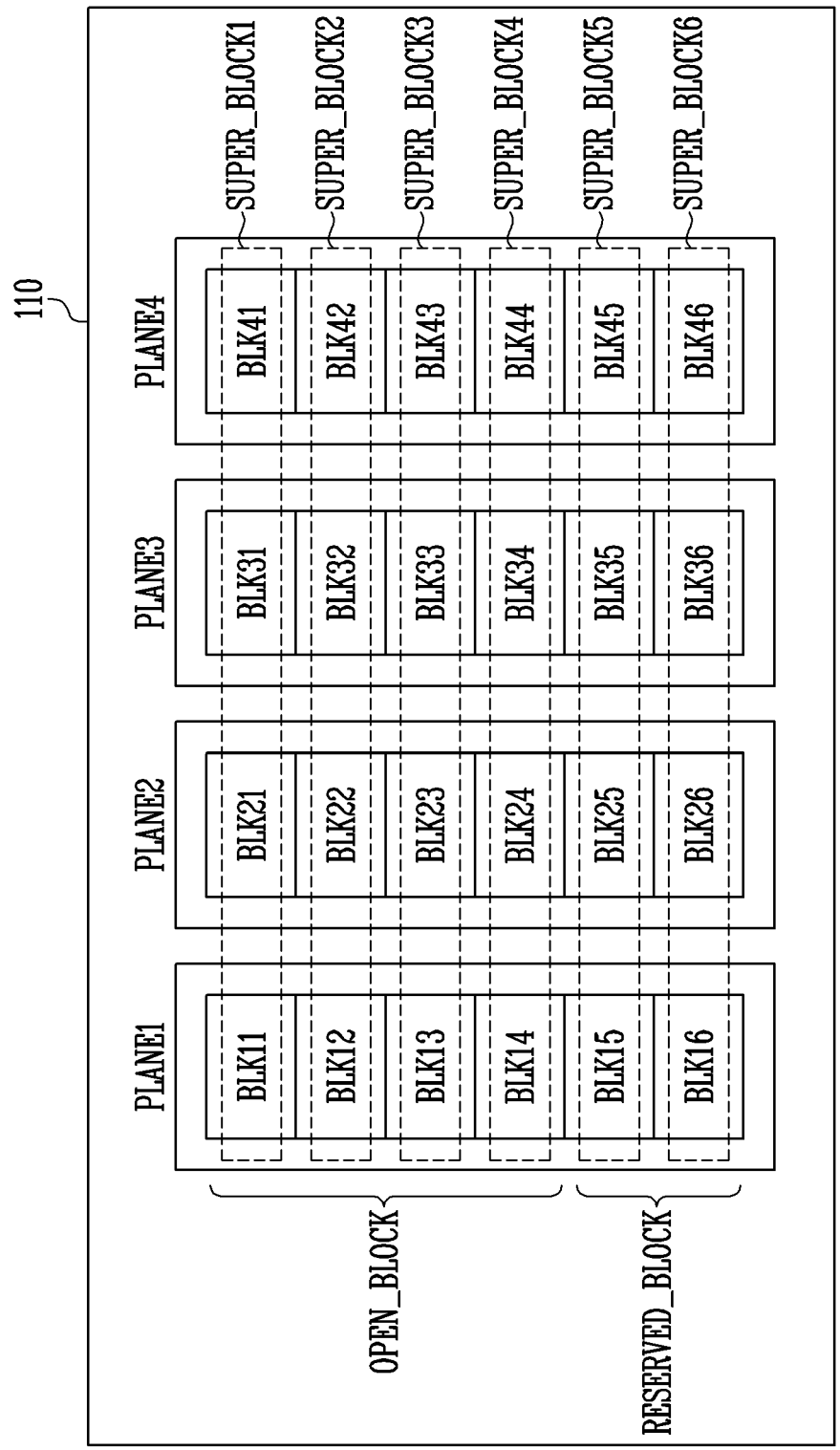
FIG. 6 is a diagram illustrating an embodiment of a memory cell array, such as that of FIG. 2.

FIG. 6 is a diagram illustrating an embodiment of the memory cell array of FIG. 2.

FIG. 6 shows an example of the memory cell array 110 configured of a plurality of planes. The memory cell array 110 of FIG. 6 may include first to fourth planes PLANE1 to PLANE4. In FIG. 6, it is assumed that each of the first to fourth planes PLANE1 to PLANE4 includes six memory blocks.

In another embodiment, the memory cell array 110 may be configured of more or less than four planes, and each plane may be configured of more less than six memory blocks.

In an embodiment, the first plane PLANE1 may include eleventh to sixteenth memory blocks BLK11 to BLK16, the second plane PLANE2 may include twenty-first to twenty-sixth memory blocks BLK21 to BLK26, the third plane PLANE3 may include thirty-first to thirty-sixth memory blocks BLK31 to BLK36, and fourth plane PLANE4 may include forty-first to forty-sixth memory blocks BLK41 to BLK46.

In an embodiment, BLK11 in PLANE1, BLK21 in PLANE2, BLK31 in PLANE3, and BLK41 in PLANE4 may configure a first super block SUPER_BLOCK1.

As described above, BLK12 in PLANE1, BLK22 in PLANE2, BLK32 in PLANE3, and BLK42 in PLANE4 may configure a second super block SUPER_BLOCK2. BLK13 in PLANE1, BLK23 in PLANE2, BLK33 in PLANE3, and BLK43 in PLANE4 may configure a third super block SUPER_BLOCK3. BLK14 in PLANE1, BLK24 in PLANE2, BLK34 in PLANE3, and BLK44 in PLANE4 may configure a fourth super block SUPER_BLOCK4. BLK15 in PLANE1, BLK25 in PLANE2, BLK35 in PLANE3, and BLK45 in PLANE4 may configure a fifth super block SUPER_BLOCK5. BLK16 in PLANE1, BLK26 in PLANE2, BLK36 in PLANE3, and BLK46 in PLANE4 may configure a sixth super block SUPER_BLOCK6.

Some memory blocks among the plurality of memory blocks included in each plane may be allocated as an open block OPEN_BLOCK, and other memory blocks may be allocated as a reserved block RESERVED_BLOCK. Any of a program operation, a read operation, and an erase operation may be performed on the open memory blocks OPEN_BLOCK. Each of the program operation and the read operation may be performed on a specific page, which is the program/read unit, among the plurality of pages in the open block OPEN_BLOCK, and the erase operation may be performed on a memory block, which is the erase unit.

When no more data can be programmed in an open block OPEN_BLOCK after the program operation is performed on the pages in the open block OPEN_BLOCK, the open block OPEN_BLOCK may be changed to a closed block CLOSED_BLOCK.

In an embodiment, the eleventh to fourteenth memory blocks BLK11 to BLK14 among the plurality of memory blocks included in the first plane PLANE1, the twenty-first to twenty-fourth memory blocks BLK21 to BLK24 among the plurality of memory blocks included in the second plane PLANE2, the thirty-first to thirty-fourth memory blocks BLK31 to BLK34 among the plurality of memory blocks included in the third plane PLANE3, and the forty-first to forty-fourth memory blocks BLK41 to BLK44 among the plurality of memory blocks included in the fourth plane PLANE4 may be allocated as open blocks OPEN_BLOCK. Any of a program operation, a read operation, and an erase operation may be performed on the open memory blocks.

In an embodiment, the fifteenth and sixteenth memory blocks BLK15 and BLK16 among the plurality of memory blocks included in the first plane PLANE1, the twenty-fifth and twenty-sixth memory blocks BLK25 and BLK26 among the plurality of memory blocks included in the second plane PLANE2, the thirty-fifth and thirty-sixth memory blocks BLK35 and BLK36 among the plurality of memory blocks included in the third plane PLANE3, and the forty-fifth and forty-sixth memory blocks BLK45 and BLK46 among the plurality of memory blocks included in the fourth plane PLANE4 may be allocated as reserved blocks RESERVED_BLOCK. In an embodiment, when an open block OPEN_BLOCK becomes a bad block, the corresponding bad block may be replaced with any one of reserved memory blocks RESERVED_BLOCK.

For example, when programming data in a specific page among pages in the open block OPEN_BLOCK, when reading data programmed in a specific page among the pages in the open block OPEN_BLOCK, or when erasing the open block OPEN_BLOCK, such operation may fail. The memory block in which the operation failed is processed as a bad block, and the corresponding bad block may be replaced with any one of the reserved blocks RESERVED_BLOCK.

A bad block generation and a method of replacing a bad block with a reserved block RESERVED_BLOCK is described in more detail with reference to FIGS. 7 to 9.

Figure 7:
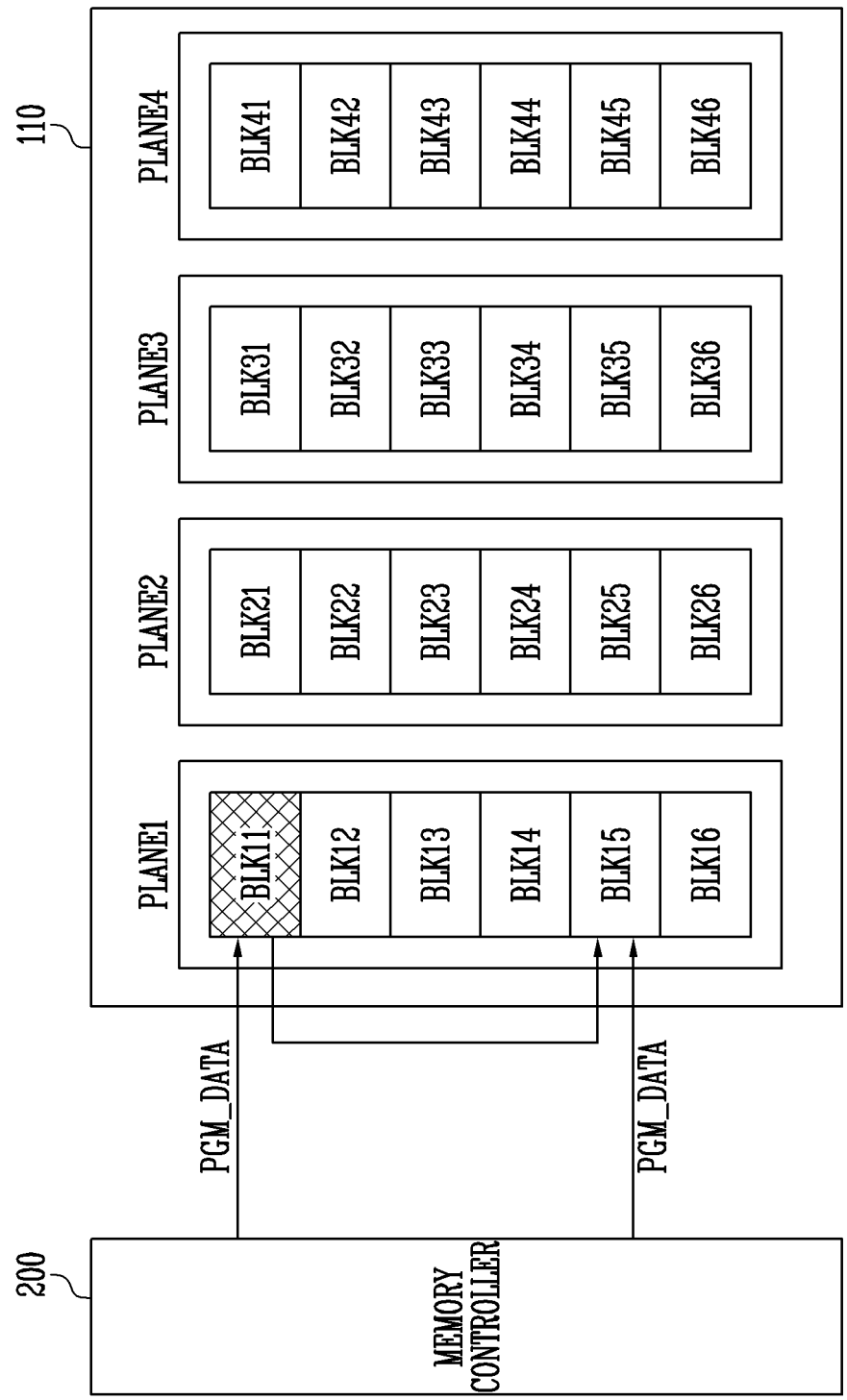
FIG. 7 is a diagram illustrating a bad block generated during a program operation and a reserved block.

FIG. 7 is a diagram illustrating a bad block generated during the program operation and a reserved block that replaces the bad block.

FIG. 7 shows a case where the program operation is performed on any one of the pages in the eleventh memory block BLK11, among the plurality of memory blocks in the first plane PLANE1, but the program operation failed.

In an embodiment, the memory controller 200 may transmit program data PGM_DATA to be programmed to the memory device 100 together with a program command (not shown) instructing the program operation. The memory device 100 may receive the program data PGM_DATA and attempt to program the received program data PGM_DATA to a specific page among the pages included in the eleventh memory block BLK11.

However, in this example, the program operation fails, and the eleventh memory block BLK11 may become a bad block. In this case, the eleventh memory block BLK11 is considered a run-time bad block (RTBB).

Since the eleventh memory block BLK11 is processed as a bad block, no data may be programmed in the pages in the eleventh memory block BLK11 anymore. Therefore, the eleventh memory block BLK11 may be replaced with any one of the fifteenth and sixteenth memory blocks BLK15 and BLK16, which are reserved blocks, in the first plane PLANE1.

In FIG. 7, it is assumed that the eleventh memory block BLK11 is replaced with the fifteenth memory block BLK15.

Therefore, program data PGM_DATA may be programmed in a specific page among pages in the fifteenth memory block BLK15.

However, when a memory block including a page in which programming failed is processed as a bad block whenever the program operation fails, there may not be enough reserved blocks available for replacing the bad blocks. Therefore, in the present disclosure, a method of recycling pages in a bad block, except for the page in which the operation failed and pages adjacent to the fail page, is provided.

The recycled pages are described in more detail with reference to FIGS. 13 to 17.

Figure 8:
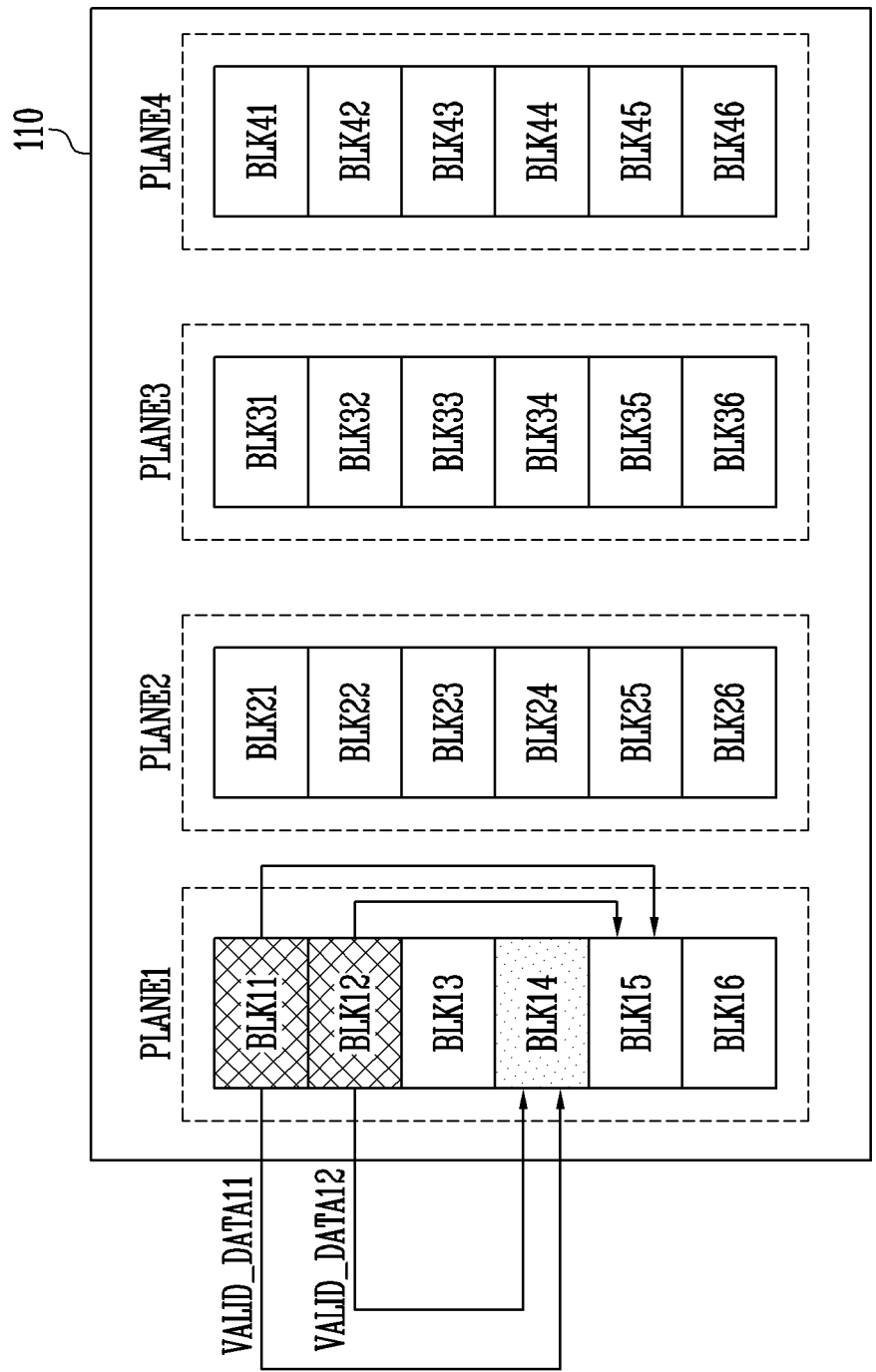
FIG. 8 is a diagram illustrating a bad block generated during a garbage collection operation and a reserved block.

FIG. 8 is a diagram illustrating a bad block generated during a garbage collection operation and a reserved block that replaces the bad block.

FIG. 8 shows a case where the eleventh and twelfth memory blocks BLK11 and BLK12 among the plurality of memory blocks included in the first plane PLANE1 are selected as a victim block and garbage collection GC is performed on the eleventh and twelfth memory blocks BLK11 and BLK12.

In an embodiment, when the garbage collection GC is performed on the first plane PLANE1, the eleventh and twelfth memory blocks BLK11 and BLK12, each of which has a relatively large number of invalid pages, may be selected as the victim block among the pages in each of the memory blocks of PLANE1. The memory block selected as the victim block may include valid pages as well as invalid pages. Here, an invalid page may be a page in which invalid data is stored, and a valid page may be a page in which valid data is stored.

In an embodiment, it is assumed that data stored in the valid pages in the eleventh memory block BLK11 is eleventh valid data VALID_DATA11 and data stored in the valid pages included in the twelfth memory block BLK12 is twelfth valid data VALID_DATA12.

When the garbage collection GC is performed, the valid data in the victim block may be programmed in a new memory block. For example, the eleventh and twelfth valid data VALID_DATA11 and VALID_DATA12 in the eleventh and twelfth memory blocks BLK11 and BLK12, which are victim blocks, respectively, may be programmed in the fourteenth memory block BLK14 that is a new memory block. Thereafter, when the eleventh and twelfth memory blocks BLK11 and BLK12 are erased, the eleventh and twelfth memory blocks BLK11 and BLK12 may each become a free block, and thus the eleventh and twelfth memory blocks BLK11 and BLK12 may be allocated as open blocks in which data may be programmed.

However, when the eleventh and twelfth valid data VALID_DATA11 and VALID_DATA12 are attempted to be programmed in the fourteenth memory block BLK14, the program operation may fail. In this case, the eleventh and twelfth valid data VALID_DATA11 and VALID_DATA12 are to be programmed in another memory block. Therefore, the fourteenth memory block BLK14 in which the program fail occurred may be a bad block, and the fourteenth memory block BLK14 may be replaced with the fifteenth memory block BLK15.

When the fourteenth memory block BLK14 is replaced with the fifteenth memory block BLK15, the eleventh and twelfth valid data VALID_DATA11 and VALID_DATA12 may be reprogrammed in the fifteenth memory block BLK15.

However, as described with reference to FIG. 7, when the memory block, including the page in which an operation failed, is processed as a bad block whenever the program operation fails, the number of reserved blocks RESERVED_BLOCK may not be sufficiently secured, i.e., there may not be enough. Therefore, in the present disclosure, a method of recycling pages in the bad block, except for the page in which failed operation occurred and the pages adjacent to the fail page, is provided.

The recycled pages are described in more detail with reference to FIGS. 13 to 17.

Figure 9:
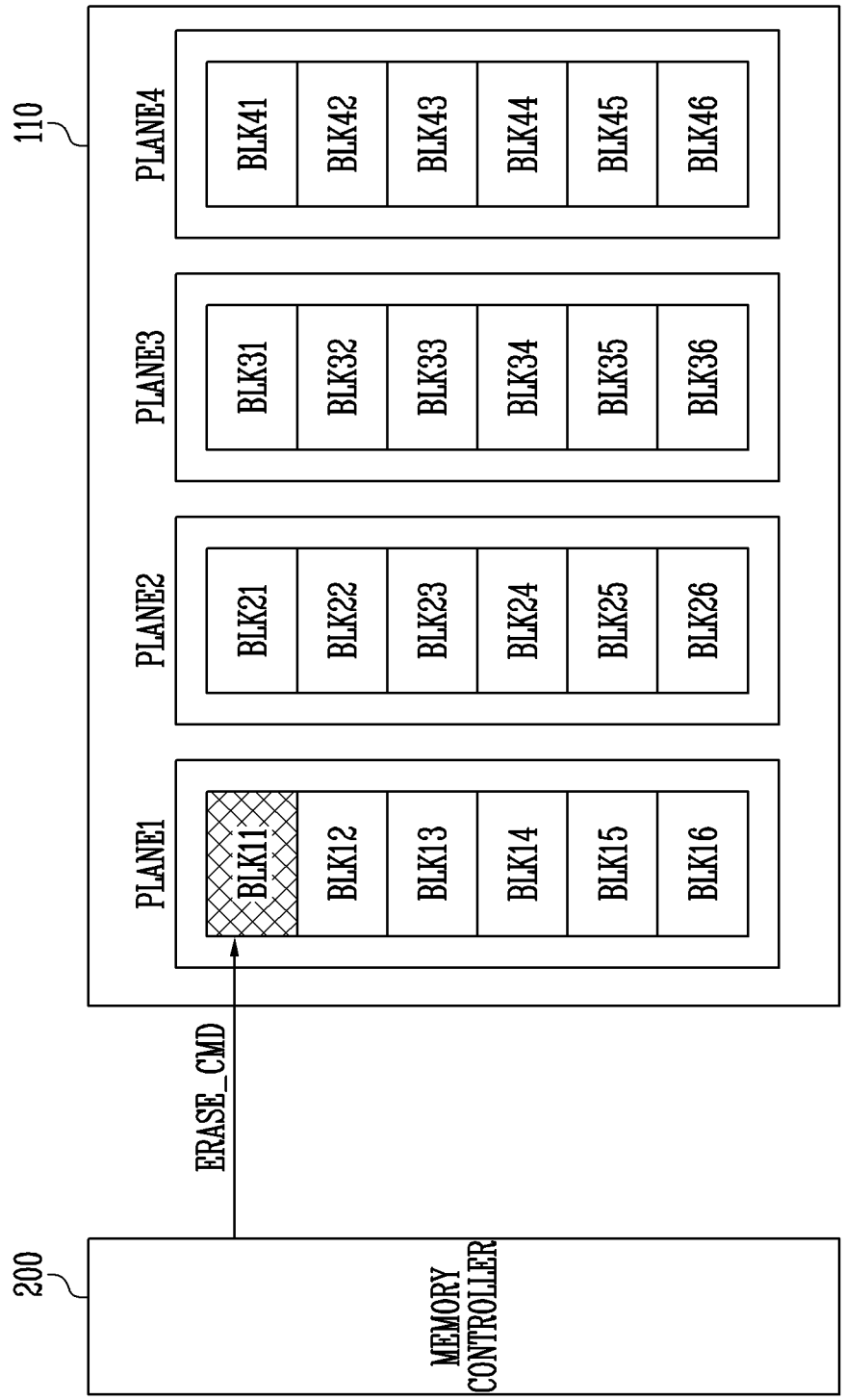
FIG. 9 is a diagram illustrating a bad block generated during an erase operation.

FIG. 9 is a diagram illustrating a bad block generated during the erase operation.

FIG. 9 shows a case where the erase operation is performed on the eleventh memory block BLK11 among the plurality of memory blocks included in the first plane PLANE1.

In an embodiment, the memory controller 200 may output an erase command instructing to perform an erase operation on the eleventh memory block BLK11 in the first plane PLANE1, to the memory device 100. The memory device 100 may perform the erase operation on the eleventh memory block BLK11 in response to the erase command. However, the erase operation on the eleventh memory block BLK11 may fail.

When the erase operation fails, the memory block on which the erase operation failed is processed as a bad block. However, the memory block in which the erase operation failed may not be replaced with another memory block. That is, since the eleventh memory block BLK11 is a memory block to be erased, it is not necessary to replace BLK11 with a memory block for programming.

Therefore, when the erase operation fails, the failed memory block is processed as a bad bock, but the failed memory block is not replaced.

Figure 10A:
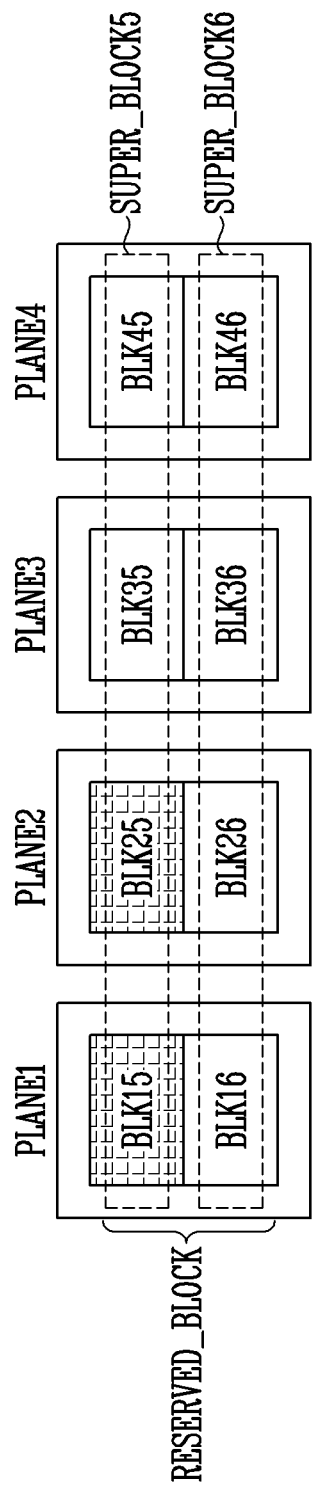
FIGS. 10A to 10C are diagrams for describing life of a memory device determined based on the number of reserved blocks.
Figure 10B:
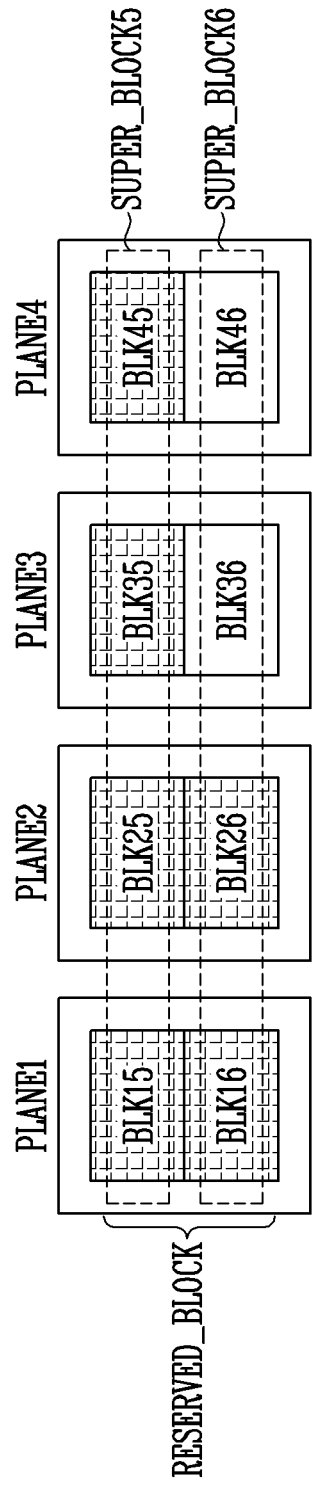
Figure 10C:
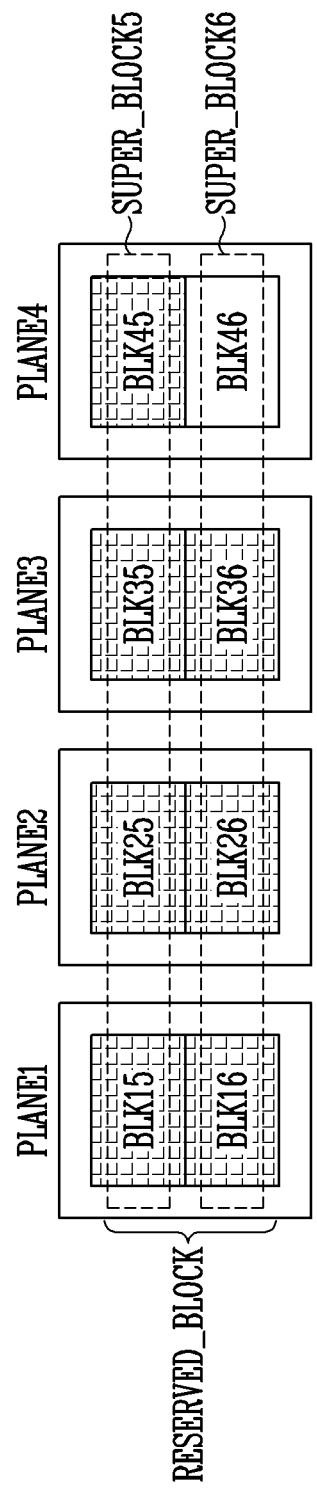

FIGS. 10A to 10C are diagrams for describing the life of the memory device determined based on the number of reserved blocks.

FIGS. 10A to 10C show only the reserved blocks among the memory blocks in the first to fourth planes PLANE1 to PLANE4 of FIG. 6. In FIGS. 10A to 10C, it is assumed that the open blocks OPEN_BLOCK in the first to fourth planes PLANE1 to PLANE4 of FIG. 6 are omitted.

In an embodiment, in FIGS. 10A to 10C, the number of total reserved blocks in the first to fourth planes PLANE1 to PLANE4 may be eight. In an embodiment, the life of the memory device 100 may be determined based on the number of unused reserved blocks RESERVED_BLOCK among all reserved blocks in the first to fourth planes PLANE1 to PLANE4, that is, the number of remaining reserved blocks.

In an embodiment, an operation of programming data or reading stored data may fail. In this case, the memory block in which the failed operation occurred may be processed as a bad block, and the bad block may be replaced with any one of the reserved blocks.

For example, FIG. 10A shows a case where an operation performed on any one of the memory blocks in the first plane PLANE1 and any one of the memory blocks in the second plane PLANE2 failed and the failed memory blocks, processed as bad blocks, are replaced with reserved blocks.

In an embodiment, the failed memory block in the first plane PLANE1 may be replaced with the fifteenth memory block BLK15, and the failed memory block in the second plane PLANE2 may be replaced with the twenty-fifth memory block BLK25.

FIG. 10B shows a case where an operation performed on two memory blocks among the memory blocks in the first plane PLANE1, two memory blocks among the memory blocks in the second plane PLANE2, any one of the memory blocks in the third plane PLANE3, and any one of the memory blocks in the fourth plane PLANE4 failed and the failed memory blocks, processed as bad blocks, are replaced with reserved blocks.

In an embodiment, the failed memory blocks in the first plane PLANE1 may be replaced with the fifteenth and sixteenth memory blocks BLK15 and BLK16, the failed memory blocks in the second plane PLANE2 may be replaced with the twenty-fifth and twenty-sixth memory blocks BLK25 and BLK26, the failed memory block in the third plane PLANE3 may be replaced with the thirty-fifth memory block BLK35, and the failed memory block in the fourth plane PLANE4 may be replaced with the forty-fifth memory block BLK45.

FIG. 10C shows a case where an operation performed on two memory blocks among the memory blocks in the first plane PLANE1, two memory blocks among the memory blocks in the second plane PLANE2, two memory blocks among the memory blocks in the third plane PLANE3, and any one of the memory blocks in the fourth plane PLANE4 failed and the failed memory blocks, processed as bad blocks, are replaced with the reserved blocks RESERVED_BLOCK.

In an embodiment, the failed memory blocks in the first plane PLANE1 may be replaced with the fifteenth and sixteenth memory blocks BLK15 and BLK16, the failed memory blocks in the second plane PLANE2 may be replaced with the twenty-fifth and twenty-sixth memory blocks BLK25 and BLK26, the failed memory blocks in the third plane PLANE3 may be replaced with the thirty-fifth and thirty sixth memory blocks BLK35 and BLK36, and the failed memory block in the fourth plane PLANE4 may be replaced with the forty-fifth memory block BLK45.

As a result, in FIG. 10A, the two memory blocks processed as bad blocks may be replaced with BLK15 and BLK25. In FIG. 10B, six memory blocks processed as bad blocks may be replaced with BLK15, BLK16, BLK25, BLK26, BLK35, and BLK45. In FIG. 10C, seven memory blocks processed as bad blocks may be replaced with BLK15, BLK16, BLK25, BLK26, BLK35, BLK36, and BLK45.

In an embodiment, the life of the memory device 100 may be determined based on the number of remaining reserved blocks, except for the reserved memory block(s) used to replace bad block(s), among all reserved blocks.

For example, when the number of remaining reserved blocks is equal to or greater than four, the life of the memory device may be at the normal level, when the number of remaining reserved blocks is equal to or less than three, the life of the memory device may be at the warning level, and when the number of remaining reserved blocks is equal to or less than one, the life of the memory device may be at the critical level.

Therefore, in FIG. 10A, since the number of remaining reserved blocks is six, the life of the memory device 100 may be at the normal level. In FIG. 10B, since the number of remaining reserved blocks is two, the life of the memory device 100 may be at the warning level. In FIG. 10C, since the number of remaining reserved blocks is one, the life of the memory device 100 may be at the critical level.

Information on the life of the memory device 100 determined based on the number of remaining reserved blocks may be included in the device health descriptor DHD generated by the flash translation layer 210. Furthermore, when the life of the memory device 100 determined based on the number of remaining reserved blocks is the critical level, the memory device 100 may recycle the bad block. That is, in the present disclosure, when the life of the memory device 100 is at the critical level, among the pages included in the bad block, the remaining pages, i.e., those in which an operation has not failed, may be recycled.

In an embodiment, the memory device 100 may determine the pages to be recycled based on the bad block table generated by the bad block controller 220. The bad block table generated by the bad block controller 220 is described in more detail with reference to FIG. 11.

FIG. 11 is a diagram illustrating a bad block table.

FIG. 11 shows the bad block table generated by the bad block controller 220 after receiving the bad block information BB_INF from the memory device 100.

In an embodiment, the bad block information BB_INF may include information on the page number #PAGE in which the program operation or the read operation failed, the number of the memory block including the corresponding page #BLOCK, the number of a plane including the corresponding memory block #PLANE, the number of the channel to which the corresponding plane is connected to the memory controller 200 #CHANNEL.

When the erase operation fails, the bad block information BB_INF may include information on the number #BLOCK of the memory block in which the erase operation failed, the number of the plane including the corresponding memory block #PLANE, and the number of the channel to which the corresponding plane is connected to the memory controller #CHANNEL.

It is assumed that the bad block table of FIG. 11 is generated by a program fail only.

In an embodiment, the first plane PLANE1 may be connected to the memory controller through a first channel, the second plane PLANE2 may be connected to the memory controller through a second channel, the third plane PLANE3 may be connected to the memory controller through a third channel, and the fourth plane PLANE4 may be connected to the memory controller through a fourth channel.

In an embodiment, as shown in FIG. 11, BLK12 and BLK13 among the memory blocks in PLANE1, BLK21 and BLK22 among the memory blocks in PLANE2, BLK32 and BLK33 among the memory blocks in PLANE3, and BLK41 among the memory blocks in PLANE4 may be processed as bad blocks.

Specifically, bad block information indicating that a failed program operation occurred in PAGE12_4 among pages in block BLK12, PAGE13_4 among pages in BLK13, PAGE21_2 among pages in block BLK21, PAGE22_2 among pages in BLK22, PAGE32_4 among pages in block BLK32, PAGE33_4 among pages in BLK33, and PAGE41_2 among pages in BLK41. Each memory block including a failed page is processed as a bad block and information on such processing may be output from the memory device 100.

The bad block controller 220 may generate the bad block table based on the bad block information.

For example, since the program fail occurred in the (12_4)-th page PAGE12_4 of the twelfth memory block BLK12, such information may be reflected in the bad block table as follows: the memory block number #BLOCK is '12', the channel number #CHANNEL is '1', the plane number #PLANE is '1', and the page number #PAGE is '12_4'.

Furthermore, since the program fail occurred in the (13_4)-th page PAGE13_4 of the thirteenth memory block BLK13, such information may be reflected in the bad block table as follows: the memory block number #BLOCK is '13', the channel number #CHANNEL is '1', the plane number #PLANE is '1', and the page number #PAGE is '13_4'.

Since the program fail occurred in the (21_2)-th page PAGE21_2 of the twenty-first memory block BLK21, such information may be reflected in the bad block table as follows: the memory block number #BLOCK is '21', the channel number #CHANNEL is '2', the plane number #PLANE is '2', and the page number #PAGE is '21_2'.

Since the program fail occurred in the (22_2)-th page PAGE22_2 of the twenty-second memory block BLK22, such information may be reflected in the bad block table as follows: the memory block number #BLOCK is '22', the channel number #CHANNEL is '2', the plane number #PLANE is '2', and the page number #PAGE is '22_2'.

Since the program fail occurred in the (32_4)-th page PAGE32_4 of the thirty-second memory block BLK32, such information may be reflected in the bad block table as follows: the memory block number #BLOCK is '32', the channel number #CHANNEL is '3', the plane number #PLANE is '3', and the page number #PAGE is '32_2'.

Since the program fail occurred in the (33_4)-th page PAGE33_4 of the thirty-third memory block BLK33, such information may be reflected in the bad block table as follows: the memory block number #BLOCK is '33', the channel number #CHANNEL is '3', the plane number #PLANE is '3', and the page number #PAGE is '33_4'.

Since the program fail occurred in the (41_2)-th page PAGE41_2 of the forty-first memory block BLK41, such information may be reflected in the bad block table as follows: the memory block number #BLOCK is '41', the channel number #CHANNEL is '4', the plane number #PLANE is '4', and the page number #PAGE is '41_2'.

When the bad block table is generated and/or updated, the recycled pages in the bad block may be determined based on the bad block table. That is, pages in memory blocks BLK12, BLK13, BLK21, BLK22, BLK32, BLK33, and BLK41, which are processed as a bad blocks, may be recycled.

A method of determining the recycled pages is described in more detail with reference to FIGS. 12 to 17.

FIG. 12 is a diagram illustrating an embodiment in which the bad block is generated.

FIG. 12 shows the page in which the program operation failed based on the bad block table of FIG. 11.

It is assumed that FIG. 12 shows only some of the memory blocks included in each plane.

In an embodiment, the twelfth and thirteenth memory blocks BLK12 and BLK13 among the memory blocks in the first plane PLANE1 may be processed as bad blocks.

Referring to FIG. 11, the program operation attempted on the (12_4)-th page PAGE12_4 of pages in the twelfth memory block BLK12 failed, and the program operation attempted on the (13_4)-th page PAGE13_4 of pages in the thirteenth memory block BLK13 failed. Therefore, BLK12 and BLK13 may be processed as bad blocks.

In an embodiment, BLK21 and BLK22 among the memory blocks in the second plane PLANE2 may be processed as bad blocks.

Referring to FIG. 11, the program operation performed on the (21_2)-th page PAGE21_2 of pages in the twenty-first memory block BLK21 failed, and the program operation performed on the (22_2)-th page PAGE22_2 of pages in the twenty-second memory block BLK22 failed. Therefore, BLK21 and BLK22 may be processed as bad blocks.

In an embodiment, BLK32 and BLK33 among the memory blocks in the third plane PLANE3 may be processed as bad blocks.

Referring to FIG. 11, the program operation performed on the (32_4)-th page PAGE32_4 of pages in the thirty-second memory block BLK32 failed, and the program operation performed on the (33_4)-th page PAGE33_4 of pages in the thirty-third memory block BLK33 failed. Therefore, BLK32 and BLK33 may be processed as bad blocks.

In an embodiment, BLK41 among the memory blocks in the fourth plane PLANE4 may be processed as a bad block.

Referring to FIG. 11, the program operation performed on the (41_2)-th page PAGE41_2 of pages in the forty-first memory block BLK41 failed. Therefore, BLK41 may be processed as a bad block.

Figure 13:
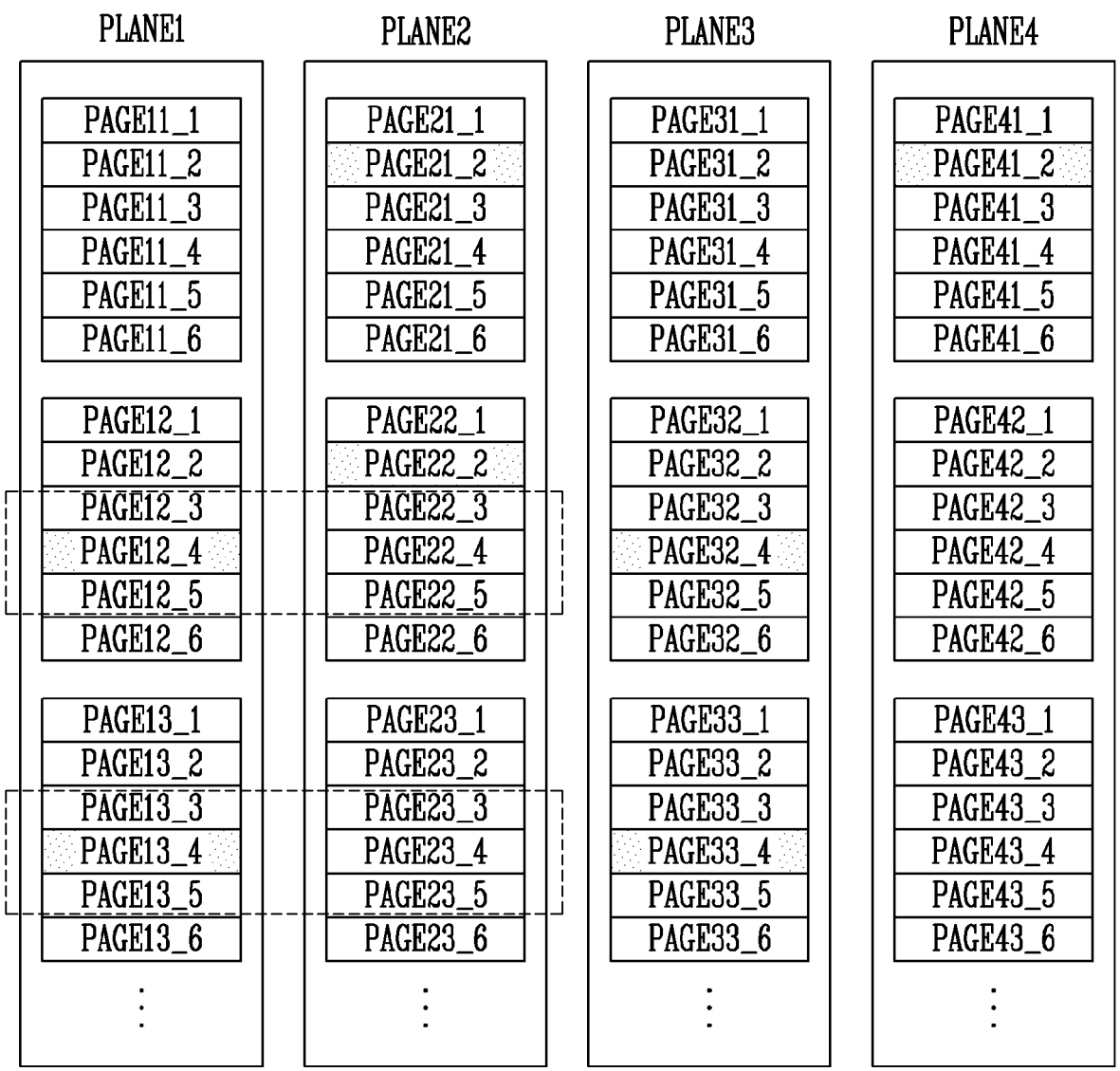
FIG. 13 is a diagram for describing pages excluded from a recycling target when recycling bad blocks included in a first plane.

FIG. 13 is a diagram for describing pages excluded from a recycling target when recycling bad blocks in the first plane.

FIG. 13 shows a method of determining the recycled pages in order to recycle the pages in the memory block processed as a bad block because the program operation attempted on a specific page among the pages in the first plane PLANE1 failed.

In an embodiment, a program fail or a read fail is likely to occur in a page adjacent to a page in which a program fail or a read fail has occurred. That is, due to a disturbance phenomenon, there is a concern that an operation in pages adjacent to a page in which the operation has already failed, will also fail. Thus, the pages adjacent to the page in which the operation has failed are excluded from the recycling target, i.e., the pages determined to be available for recycling.

Therefore, among the pages in BLK12 of the first plane PLANE1, pages PAGE12_3 and PAGE12_5 adjacent to page PAGE12_4 in which the program fail occurred may be excluded from the recycling target.

Furthermore, pages in BLK22 of the second plane PLANE2 adjacent to the twelfth memory block BLK12 of the first plane PLANE1, as well as pages in BLK12 of the first plane PLANE1, may be excluded from the recycling target.

Specifically, among the pages in BLK22 of the second plane PLANE2, page PAGE22_4 adjacent to page PAGE12_4 in which the program fail occurred and pages PAGE22_3 and PAGE22_5 adjacent to page PAGE22_4 may be excluded from the recycling target.

As described above, among the pages in BLK13 of the first plane PLANE1, pages PAGE13_3 and PAGE13_5 adjacent to page PAGE13_4 in which the program fail occurred may be excluded from the recycling target.

In addition, among the pages in BLK23 of the second plane PLANE2 adjacent to the thirteenth memory block BLK13, page PAGE23_4 adjacent to page PAGE13_4 in which the program fail occurred and pages PAGE23_3 and PAGE23_5 adjacent to page PAGE23_4 may be excluded from the recycling target.

As a result, pages adjacent to page PAGE12_4 and page PAGE13_4 in which the program fail occurred may be excluded from the recycling target. In addition to the pages in PLANE1 in which the program fail occurred, some of the pages in PLANE2 may be excluded.

Figure 14:
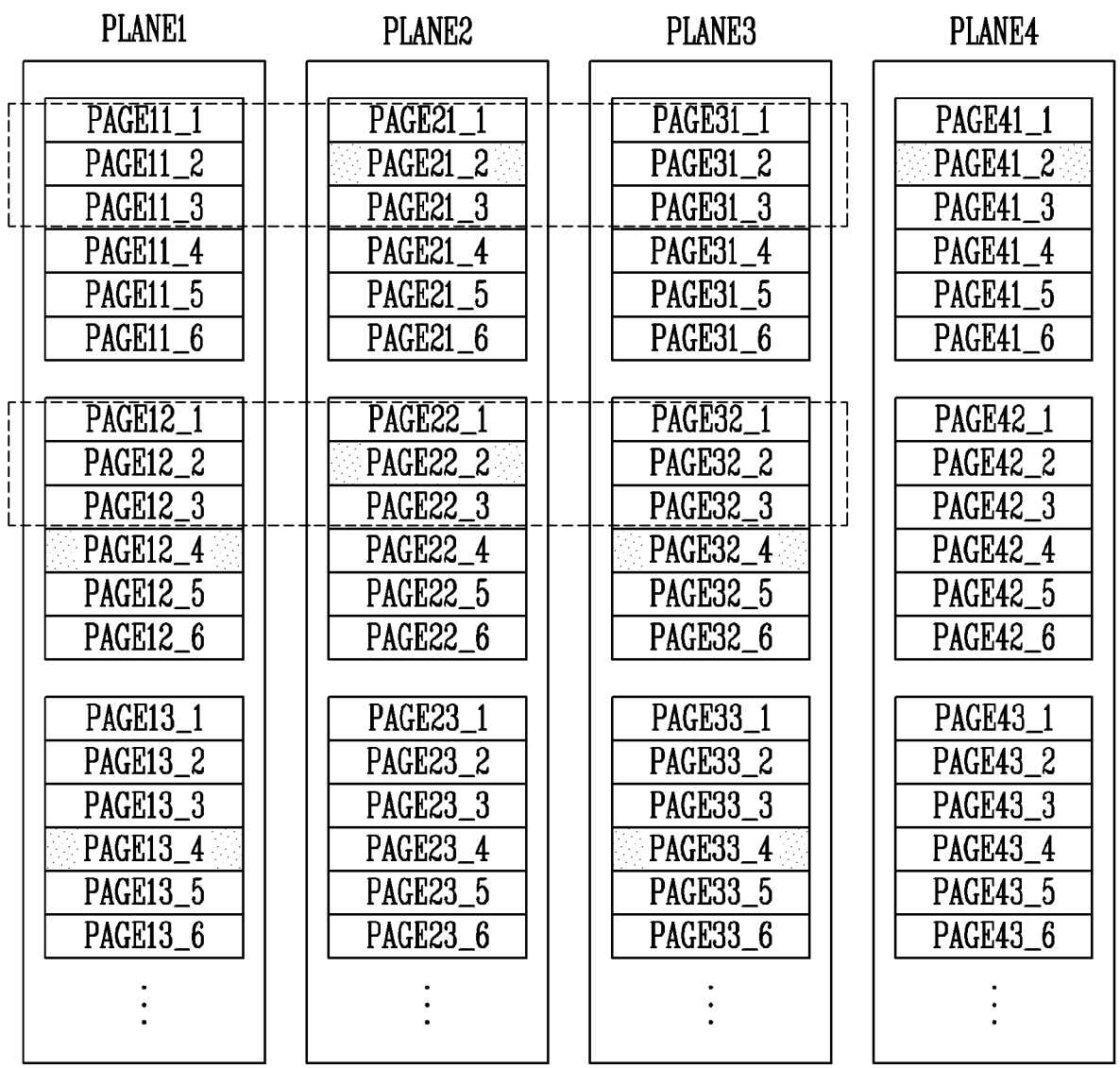
FIG. 14 is a diagram for describing pages excluded from a recycling target when recycling bad blocks included in a second plane.

FIG. 14 is a diagram for describing the pages excluded from the recycling target when recycling bad blocks included in the second plane.

Referring to FIGS. 12 and 14, FIG. 14 shows a method of determining the recycled pages in order to recycle pages included in a memory block processed as a bad block because a program operation attempted on a specific page among the pages in the second plane PLANE2 failed.

In an embodiment, a program fail or a read fail is likely to occur in a page adjacent to a page in which a program fail or a read fail has occurred. That is, due to a disturbance phenomenon, there is a concern that an operation in pages adjacent to a page in which the operation has failed will also fail. Thus, the pages adjacent to the page in which the operation has failed are excluded from the recycling target.

Therefore, among the pages in BLK21 of the second plane PLANE2, pages PAGE21_1 and PAGE21_3 adjacent to page PAGE21_2 in which the program fail occurred may be excluded from the recycling target.

Furthermore, some of the pages in BLK11 of the first plane PLANE1 and pages PAGE31_1 to PAGE31_6 in BLK31 of the third plane PLANE3 adjacent to BLK21 of the second plane PLANE2, as well as pages in block BLK21 of the second plane PLANE2, may be excluded from the recycling target.

Specifically, in BLK11 of the first plane PLANE1, page PAGE11_2 adjacent to page PAGE21_2 in which the program fail occurred and pages PAGE11_1 and PAGE11_3 adjacent to page PAGE11_2 may be excluded from the recycling target. In addition, in BLK31 of the third plane PLANE3, page PAGE31_2 adjacent to page PAGE21_2 in which the program fail occurred and pages PAGE31_1 and PAGE31_3 adjacent to page PAGE31_2 may be excluded from the recycling target.

As described above, in BLK22 of the second plane PLANE2, pages PAGE22_1 and PAGE22_3 adjacent to page PAGE22_2 in which the program fail occurred may be excluded from the recycling target.

In addition, among the pages in BLK12 of the first plane PLANE1 adjacent to BLK22, PAGE12_2 adjacent to page PAGE22_2 in which the program fail occurs and pages PAGE12_1 and PAGE12_3 adjacent to page PAGE12_2 may be excluded from the recycling target. In addition, among the pages PAGE32_1 to PAGE32_6 included in BLK32 of the third plane PLANE3 adjacent to BLK22, page PAGE32_2 adjacent to page PAGE22_2 in which the program fail occurs and pages PAGE32_1 and PAGE32_3 adjacent to page PAGE32_2 may be excluded from the recycling target.

As a result, pages adjacent to the (21_2)-th page PAGE21_2 and the (22_2)-th page PAGE22_2 in which the program fail occurs may be excluded from the recycling target. In addition to the pages in PLANE2 in which the program fail occurs, some of the pages in PLANE1 and PLANE3 may be excluded.

Figure 15:
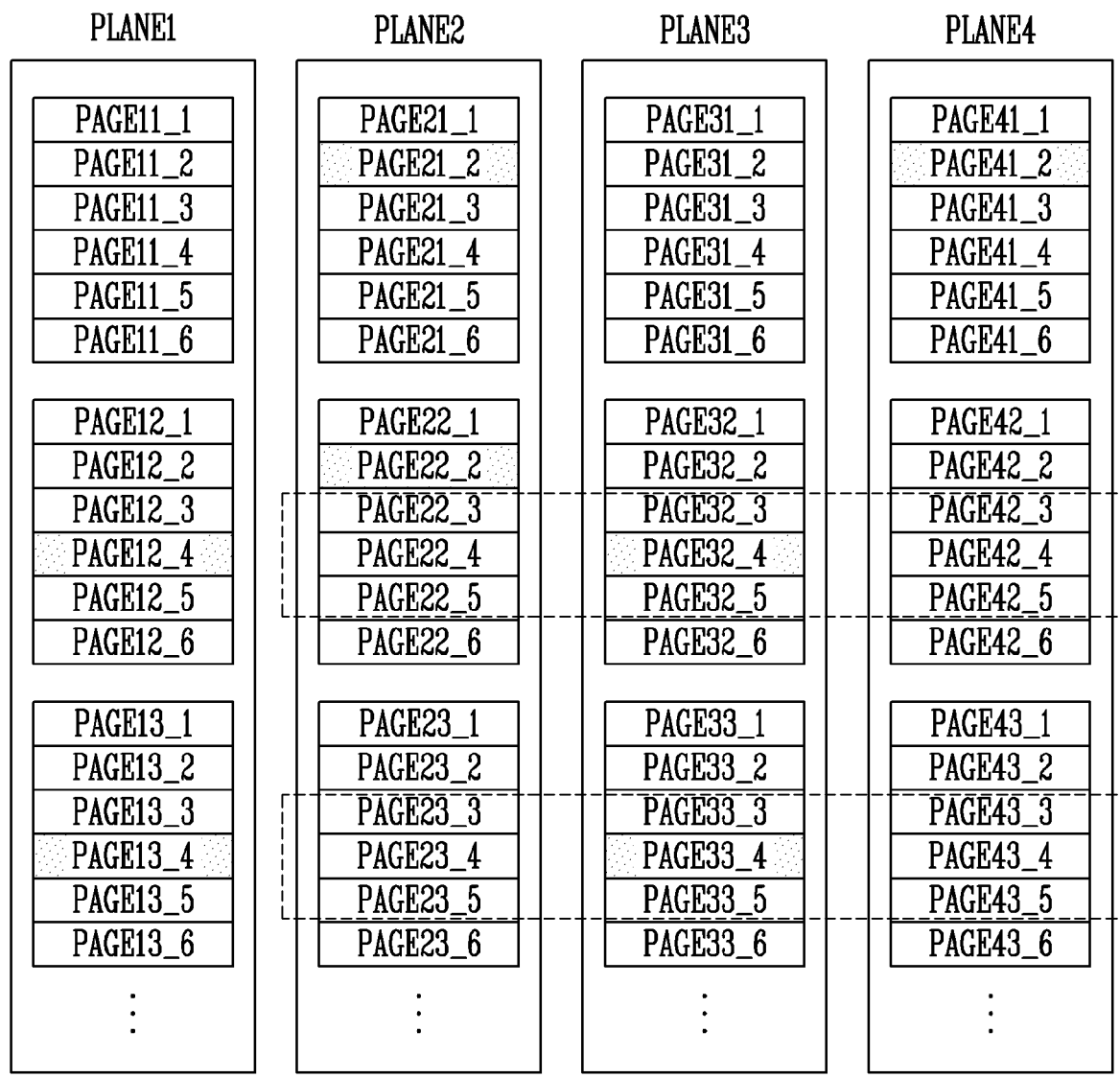
FIG. 15 is a diagram for describing pages excluded from a recycling target when recycling bad blocks included in a third plane.

FIG. 15 is a diagram for describing the pages excluded from the recycling target when recycling bad blocks in the third plane.

FIG. 15 shows a method of determining recycled pages in order to recycle pages in the memory block processed as a bad block because the program operation performed on a specific page among the pages in the third plane PLANE3 failed.

In an embodiment, a program fail or a read fail is likely to occur in a page adjacent to a page in which a program fail or a read fail occurred. That is, due to a disturbance phenomenon, there is a concern that an operation will fail again in pages adjacent to a page in which the operation has failed. Thus, the pages adjacent to the page in which the operation failed are excluded from the recycling target.

Therefore, among the pages PAGE32_1 to PAGE32_6 included in BLK32 of the third plane PLANE3, pages PAGE32_3 and PAGE32_5 adjacent to page PAGE32_4 in which the program fail occurred may be excluded from the recycling target.

Furthermore, some of the pages in BLK22 of the second plane PLANE2 and the pages PAGE42_1 to PAGE42_6 in BLK42 of the fourth plane PLANE4 adjacent to BLK32 of the third plane PLANE3, as well as BLK32 of the third plane PLANE3, may be excluded from the recycling target.

Specifically, among the pages in BLK22 of the second plane PLANE2, page PAGE22_4 adjacent to page PAGE32_4 in which the program fail occurred and pages PAGE22_3 and PAGE22_5 adjacent to PAGE22_4 may be excluded from the recycling target. In addition, among the pages in BLK42 of the fourth plane PLANE4, page PAGE42_4 adjacent to page PAGE32_4 in which the program fail occurred and pages PAGE42_3 and PAGE42_5 adjacent to page PAGE42_4 may be excluded from the recycling target.

As described above, among the pages in BLK33 of the third plane PLANE3, pages PAGE33_3 and PAGE33_5 adjacent to page PAGE33_4 in which the program fail occurred may be excluded from the recycling target.

In addition, among the pages in BLK23 of the second plane PLANE2 adjacent to BLK33, page PAGE23_4 adjacent to page PAGE33_4 in which the program fail occurred and pages PAGE23_3 and PAGE23_5 adjacent to page PAGE23_4 may be excluded from the recycling target. In addition, among the pages in BLK43 of the fourth plane PLANE4 adjacent to BLK33, page PAGE43_4 adjacent to page PAGE33_4 in which the program fail occurred and pages PAGE43_3 and PAGE43_5 adjacent to page PAGE43_4 may be excluded from the recycling target.

As a result, pages adjacent to page PAGE32_4 and page PAGE33_4 in which the program fail occurred may be excluded from the recycling target. In addition to the pages in PLANE3 in which the program fail occurred, some of the pages in PLANE2 and PLANE4 may be excluded.

Figure 16:
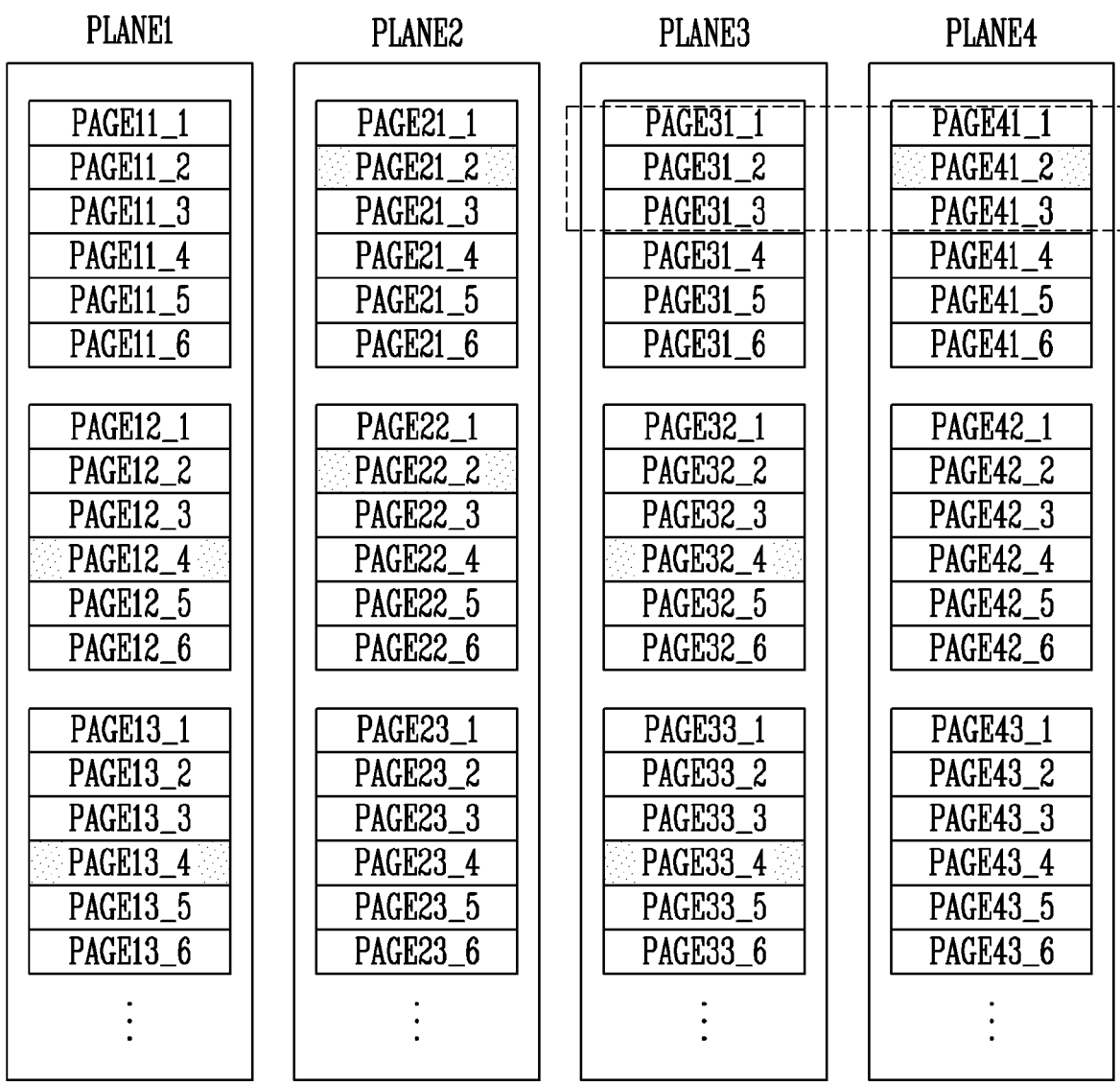
FIG. 16 is a diagram for describing pages excluded from a recycling target when recycling bad blocks included in a fourth plane.

FIG. 16 is a diagram for describing pages excluded from the recycling target when recycling bad blocks in the fourth plane.

FIG. 16 shows a method of determining the recycled pages in order to recycle pages in the memory block processed as a bad block because the program operation performed on a specific page among the pages in the fourth plane PLANE4 failed.

In an embodiment, a program fail or a read fail is likely to occur in a page adjacent to a page in which a program fail or a read fail occurred. That is, due to a disturbance phenomenon, since there is a concern that an operation will again in pages adjacent to a page in which the operation has failed. Thus, the pages adjacent to the page in which the operation is failed are excluded from the recycling target.

Therefore, among the pages in BLK41 of the fourth plane PLANE4, pages PAGE41_1 and PAGE41_3 adjacent to page PAGE41_2 in which the program fail occurred may be excluded from the recycling target.

Furthermore, some of the pages in BLK31 of the third plane PLANE3 adjacent to BLK41 of the fourth plane PLANE4, as well as BLK41 of the fourth plane PLANE4, may be excluded from the recycling target.

Specifically, among the pages in BLK31 of the third plane PLANE3, PAGE31_2 adjacent to page PAGE41_2 in which the program fail occurred and pages PAGE31_1 and PAGE31_3 adjacent to page PAGE31_2 may be excluded from the recycling target.

As a result, pages adjacent to page PAGE41_2 may be excluded from the recycling target. In addition to the pages in PLANE4 in which the program fail occurred, some of the pages in PLANE3 may be excluded.

FIG. 17 is a diagram for describing recycled pages when recycling bad blocks in the first to fourth planes.

FIG. 17 shows the pages except for the pages determined to be excluded from the recycling target.

In an embodiment, the fail of the program operation may occur in page PAGE12_4 among the pages included in BLK12 of the first plane PLANE1, in page PAGE13_4 among the pages included in BLK13 of the first plane PLANE1, in page PAGE21_2 among the pages in BLK21 of the second plane PLANE2, in page PAGE22_2 among the pages in BLK22 of the second plane PLANE2, in page PAGE32_4 among the pages in BLK32 of the third plane PLANE3, in page PAGE33_4 among the pages in BLK33 of the third plane PLANE3, and in page PAGE41_2 among the pages in BLK41 of the fourth plane PLANE4.

In addition, the pages adjacent to the pages in which the program fail occurs described above may be excluded from the recycling target.

Therefore, the bad block controller 220 in the memory controller 200 may determine the life of the memory device 100 based on the device health descriptor DHD received from the flash translation layer 210. When the determined life of the memory device 100 is at the critical level, the bad block controller 220 in the memory controller 200 may recycle pages in the bad block based on the recycling information RECYCLING_INF generated based on the bad block information BB_INF received from the memory device.

Therefore, page PAGE12_6 among the pages in BLK12 processed as a bad block in the first plane PLANE1, and pages PAGE13_1, PAGE13_2, and PAGE13_6 among the pages in BLK13 may be recycled. Also, pages PAGE11_4 to PAGE11_6 among the pages in BLK 11 may be recycled.

In a case of the second plane PLANE2, pages PAGE21_4 to PAGE21_6 among the pages in BLK21 processed as a bad block, and page PAGE22_6 among the pages in in BLK22 may be recycled. Also, pages PAGE23_1, PAGE23_2 and PAGE23_6 among the pages in BLK 23 may be recycled.

In a case of the third plane PLANE3, page PAGE32_6 among the pages in BLK32 processed as a bad block, and pages PAGE33_1, PAGE33_2, and PAGE33_6 among the pages in BLK33 may be recycled. Also, pages PAGE31_4 to PAGE11_6 among the pages in BLK 31 may be recycled.

In a case of the fourth plane PLANE4, pages PAGE41_4 to PAGE41_6 among the pages in BLK41 processed as a bad block may be recycled. Also, pages PAGE42_1, PAGE42_2 and PAGE42_6 among the pages in BLK 42 and PAGE43_1, PAGE43_2 and PAGE43_6 among the pages in BLK 43 may be recycled.

Figure 18:
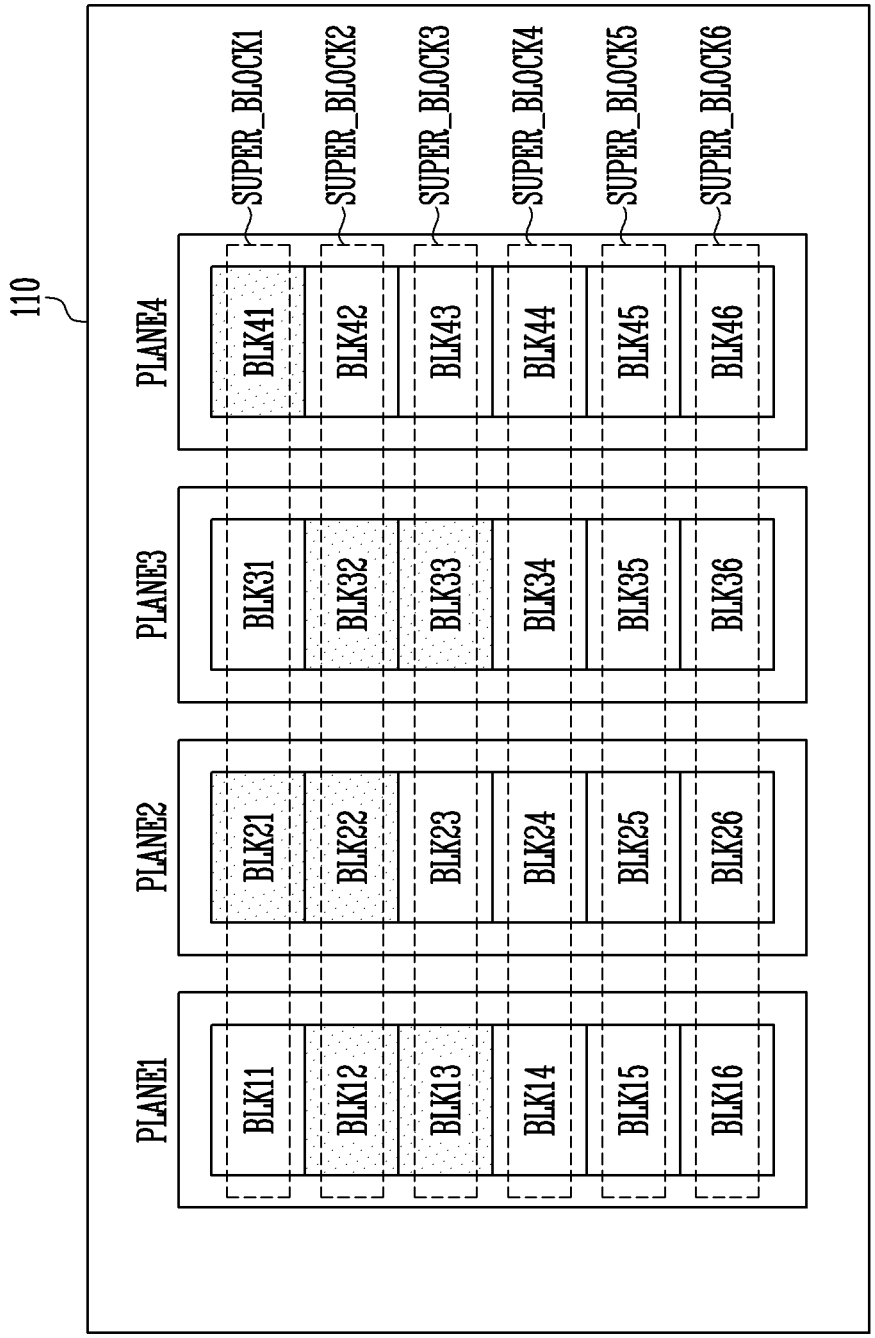
FIG. 18 is a diagram for describing memory blocks excluded from a recycling target when an erase operation failed.

FIG. 18 is a diagram for describing memory blocks excluded from the recycling target when the erase operation is failed.

FIG. 18 shows the memory cell array 110 of FIG. 6.

In an embodiment, after the program operation is performed, the memory block on which the program operation is performed may be erased. However, the erase operation may fail.

Referring to FIG. 18, the erase operation performed on BLK12, BLK13, BLK21, BLK22, BLK32, BLK33, and BLK41 among the memory blocks in the first to fourth planes PLANE1 to PLANE4 may fail. When the erase operation fails, a corresponding memory block may be processed as a bad block and may not be replaced with another memory block.

When the erase operation fails, pages in the failed memory block are not recycled, unlike the situation in which a program or read operation fails. Since the erase operation is performed in a memory block unit, when the erase operation fails, data stored in all pages in the corresponding memory block may not be trusted.

Furthermore, all memory blocks in a super block including the memory block in which the erase operation failed may not be used.

For example, in FIG. 18, since the erase operation performed on BLK12, BLK22, or BLK32 failed, all memory blocks in SUPER_BLOCK2 may not be used. In addition, since the erase operation performed on BLK13 or BLK33 failed, all memory blocks in SUPER_BLOCK3 may not be used. In addition, since the erase operation performed on BLK21 or BLK41 failed, all memory blocks in SUPER_BLOCK1 may not be used.

Therefore, since the erase operation for BLK21 and BLK41 among the memory blocks SUPER_BLOCK1 failed, even though BLK11 and BLK31 are processed as bad blocks, the pages in BLK11 and BLK31 may not be recycled.

In a case of SUPER_BLOCK2, since the erase operation for BLK12, BLK22, and BLK32 among the memory blocks in SUPER_BLOCK2 failed, even though BLK42 is processed as a bad block, the pages in BLK42 may not be recycled.

In a case of SUPER_BLOCK3, since the erase operation for BLK13 and BLK33 among the memory blocks in SUPER_BLOCK3 failed, even though BLK23 and BLK43 are processed as bad blocks, the pages in BLK23 and BLK43 may not be recycled.

Figure 19:
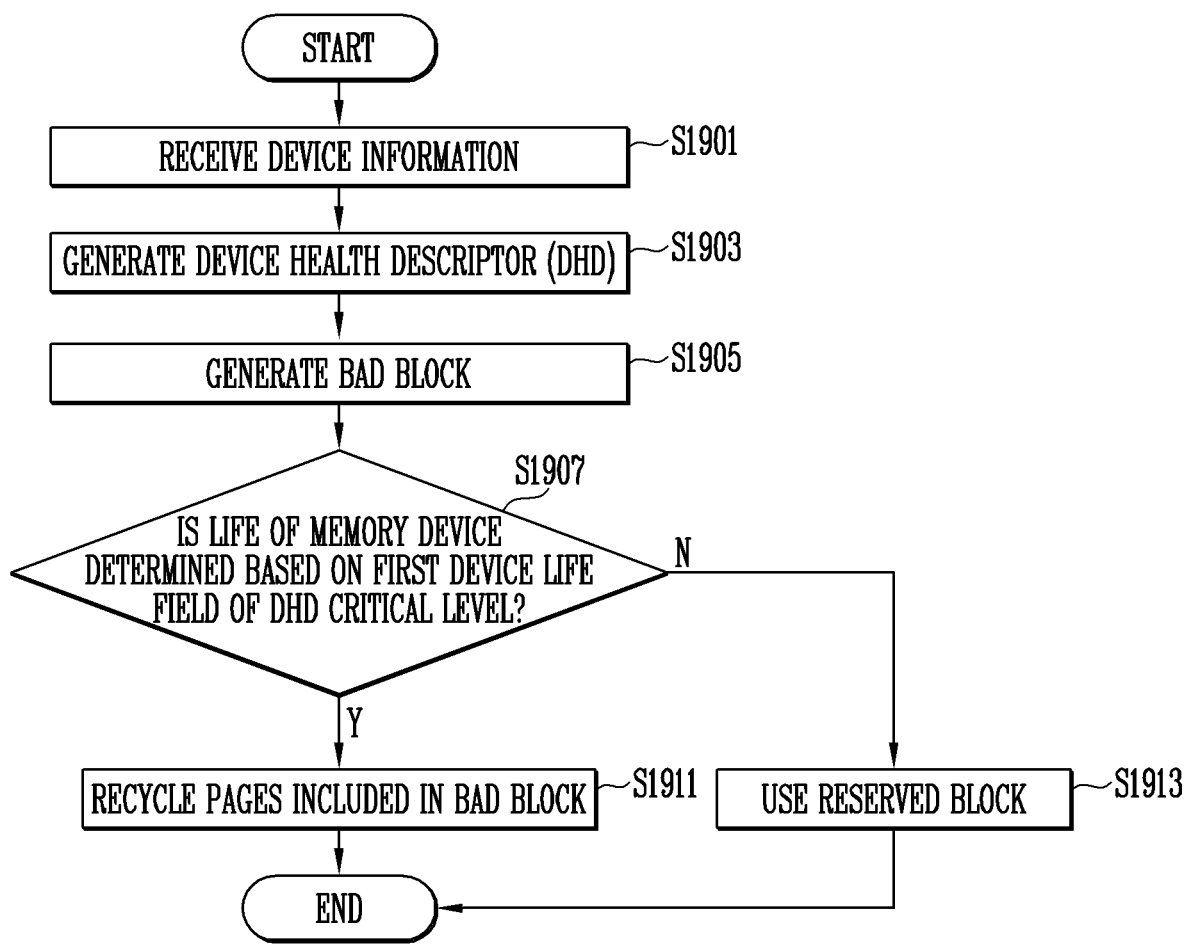
FIG. 19 is a diagram for describing an operation of a memory controller according to an embodiment of the present disclosure.

FIG. 19 is a diagram for describing an operation of the memory controller according to an embodiment of the present disclosure.

Referring to FIG. 19, in step S1901, the memory controller may receive the device information from the memory device. The device information may include information on the number of times the program operation and the erase operation has been performed on the memory device, the number of reserved blocks in the memory device, and the number of times the refresh operation has been performed on the memory device. The device information may be output from the memory device when the state of the memory device changes, during performance of a background operation, or in response to a request of the memory controller.

In step S1903, the memory controller may generate the device health descriptor DHD based on the device information received from the memory device. The DHD may be configured of a plurality of fields indicating various items of information, respectively, on the memory device.

For example, the DHD may have a field indicating the life of the memory device determined based on the number of remaining reserved blocks in the memory device, a field indicating the life of the memory device determined based on the number of times the program/erase operation has been performed, a field indicating the number of times the refresh operation has been performed on the memory device, and the like.

After the DHD is generated based on the device information, the operation performed on the memory device may fail and thus a bad block may be generated (S1905). The memory controller may determine whether to recycle pages in the bad block that were not involved in the failed operation based on a specific field among the fields included in the DHD.

In step S1907, the memory controller may determine whether the life of the memory device determined based on a value in a first device life field of the DHD is at the critical level. The first device life field may include a value indicating the life of the memory device determined based on the number of reserved blocks in the memory device.

When the value in the first device life field indicates that the life of the memory device is at the critical level (Y at S1907), the memory controller may determine to recycle pages in the bad block in the memory device (S1911). That is, the life of the memory device may be further extended by recycling select pages in the bad block.

However, when the value in the first device life field indicates that the life of the memory device is not at the critical level (N at S1907), that is, when the first device life field value indicates the life of the memory device is at the normal or warning level, the memory controller may use the reserved blocks in the memory device without recycling the pages in the bad block in the memory device (S1913). Since the life of the memory device is not at the critical level yet, the memory controller may replace the memory block in which the operation failed with a reserved block.

Figure 20:
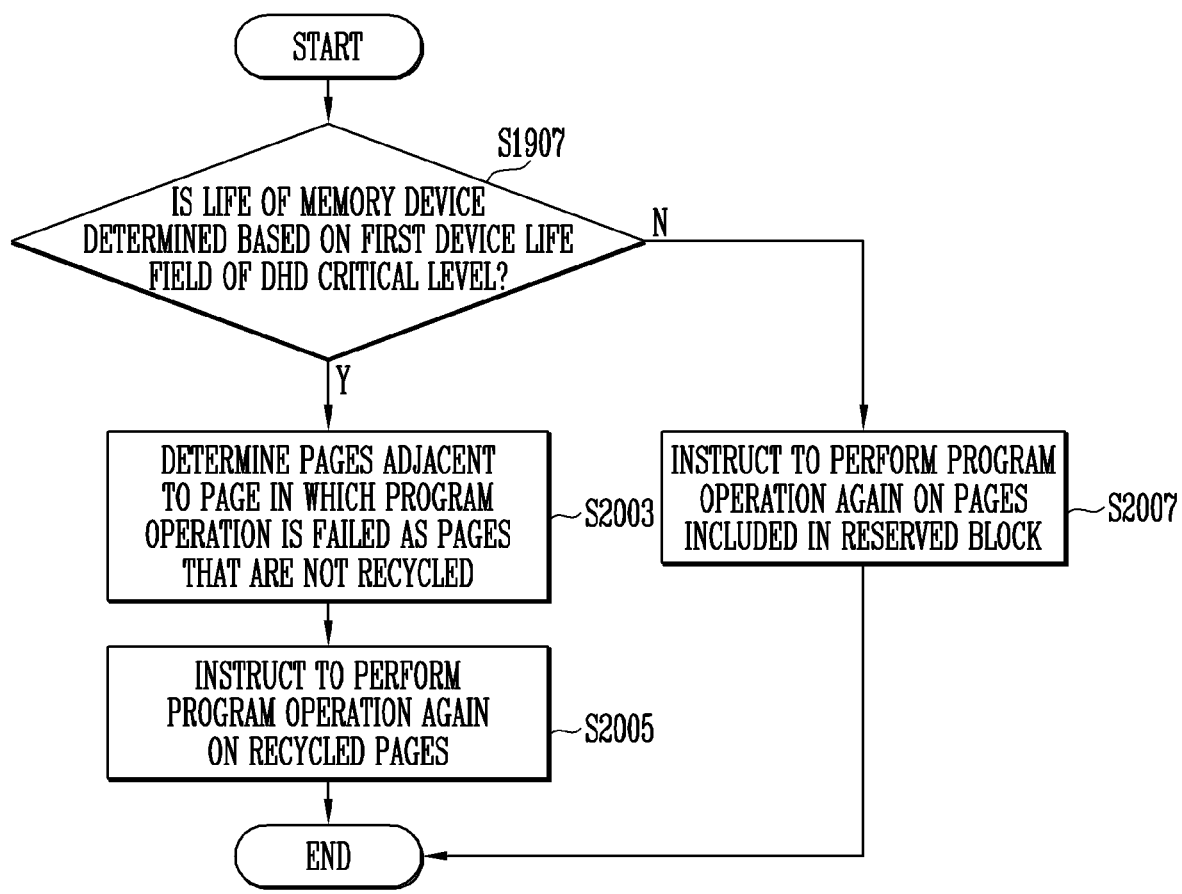
FIG. 20 is a diagram for describing an operation of a memory controller according to an embodiment of the present disclosure.

FIG. 20 is a diagram for describing operation of the memory controller according to an embodiment of the present disclosure.

Referring to FIG. 20, in step S1907, the memory controller may determine whether the life of the memory device determined based on the value of the first device life field of the DHD is at the critical level. The first device life field value may indicate the life of the memory device determined based on the number of remaining reserved blocks in the memory device.

When the first device life field value indicates that the life of the memory device is at the critical level (Y at S1907), the memory controller may determine to perform the program operation by recycling pages in a bad block in the memory device.

First, in step S2003, the pages adjacent to the page in which the program operation failed may be determined as pages that are not to be recycled. The pages that are not to be recycled may include not only the failed page of the memory block on which the program operation failed, but also some of the pages in the memory block adjacent to that memory block.

Once the pages that are not to be recycled are determined, the memory controller may instruct that the program operation be performed again on the recycled pages among the pages in the bad block. Therefore, the memory device may perform the program operation again on the recycled pages among the pages in the bad block. That is, the life of the memory device may be further extended by recycling select pages in the bad block.

However, when the first device life field value indicates that the life of the memory device is not at the critical level (N at S1907), that is, when the first device life field value indicates that the life of the memory device is at the normal or warning level, the memory controller may instruct that the program operation be performed again on the pages in the reserved block.

Therefore, the memory controller may instruct to use the reserved block in the memory device without recycling the pages in the bad block in the memory device. That is, since the life of the memory device is not at the critical level yet, the memory controller may replace the memory block in which the operation failed with the reserved block.

Figure 21:
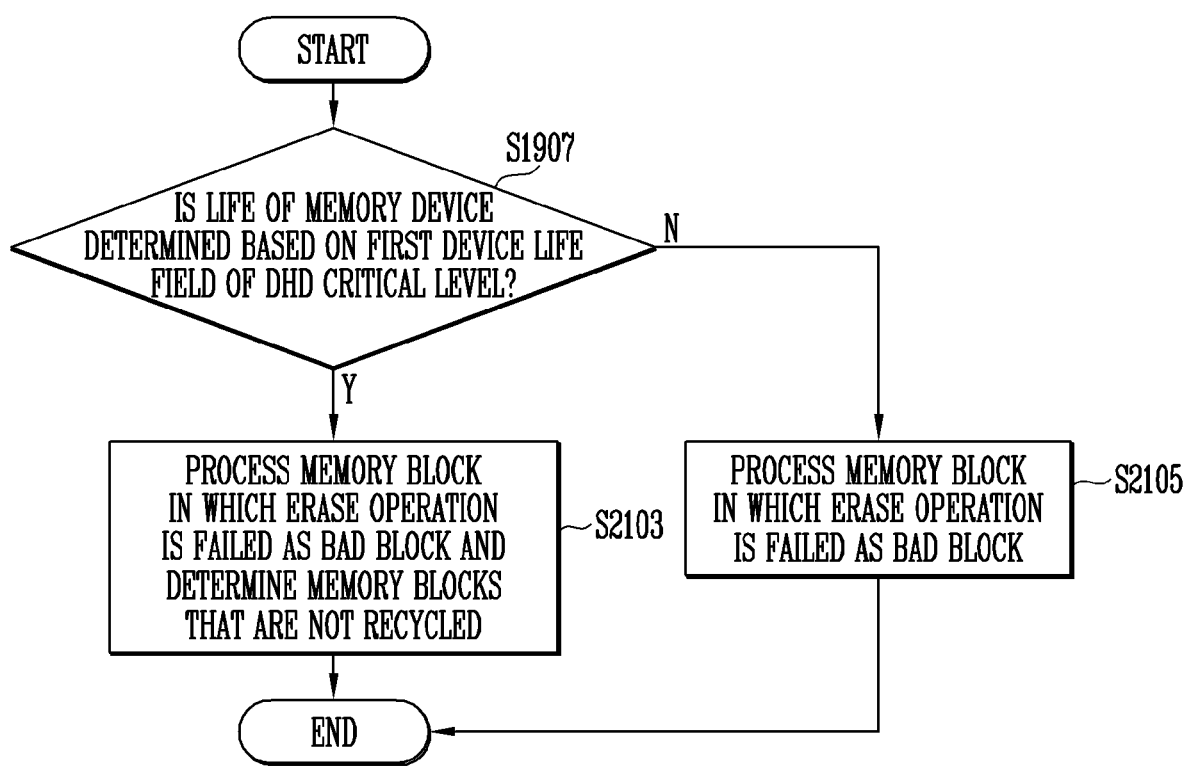
FIG. 21 is a diagram for describing an operation of a memory controller according to an embodiment of the present disclosure.

FIG. 21 is a diagram for describing operation of the memory controller according to an embodiment of the present disclosure.

Referring to FIG. 21, in step S1907, the memory controller may determine whether the life of the memory device determined based on the first device life field value of the DHD is at the critical level. The first device life field value may indicate the life of the memory device determined based on the number of remaining reserved blocks in the memory device.

When the first device life field indicates that the life of the memory device is at the critical level (Y at S1907), the memory controller may process the memory block in which the erase operation failed as a bad block and determine the memory blocks that are not recycled (S2103).

For example, all memory blocks in the super block including the memory blocks in which the erase operation failed may not be recycled. Therefore, even though the memory blocks in a corresponding super block are processed as bad blocks, the pages in the memory blocks processed as bad blocks may not be recycled.

However, when the first device life field value indicates that the life of the memory device is not at the critical level (N at S1907), that is, when the first device life field value indicates that the life of the memory device is at the normal or warning level, the memory controller may process the memory block in which the erase operation failed as a bad block. As a result, when the life of the memory device is not at the critical level, recycled pages in the bad block may not be determined.

Figure 22:
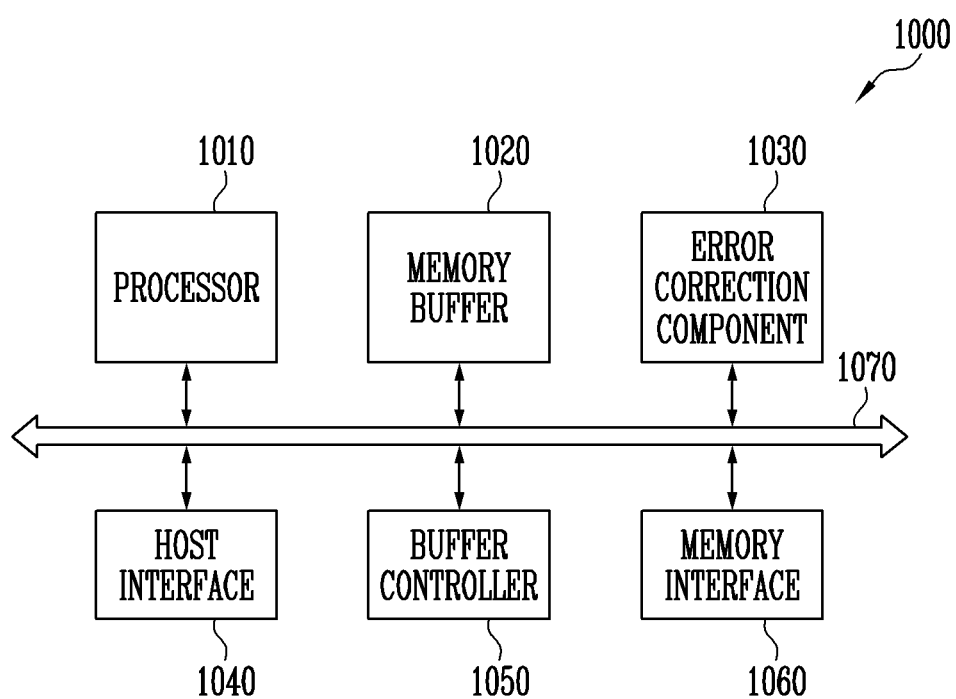
FIG. 22 is an illustrating another embodiment of a memory controller, such as that of FIG. 1.

FIG. 22 is a diagram illustrating another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 22, the memory controller 1000 may include a processor 1010, a memory buffer 1020, an error correction component (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operation of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. Examples of address mapping methods include a page mapping method, a block mapping method, and a hybrid mapping method.

In an embodiment, the processor 1010 may receive the device information from the memory device 100 to generate the device health descriptor DHD. The device information may include information on the number of times each of a program operation and an erase operation has been performed on the memory device 100, the number of reserved blocks included in the memory device 100, and the number of times a refresh operation has been performed on the memory device 100.

In addition, the DHD may be configured of the plurality of fields, and any one of the plurality of fields may indicate a first device life related to the life of the memory device 100 determined based on the number of remaining reserved blocks in the memory device 100.

Thereafter, the processor 1010 may determine whether to recycle pages in the bad block based on the first device life in the DHD. For example, when the value indicating the first device life indicates the critical level, the processor 1010 may determine to recycle pages in the bad block. The critical level may be determined based on the number of remaining reserved blocks in the memory device 100.

Furthermore, it may be determined that, among pages in the bad block, all pages except the failed page and pages adjacent to the failed page, are recycled.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction component 1030 may perform error correction. The error correction component 1030 may perform error correction encoding (ECC encoding) based on data to be written to the memory device through memory interface 1060. The error correction encoded data may be transferred to the memory device through the memory interface 1060. The error correction component 1030 may perform error correction decoding (ECC decoding) on the data received from the memory device through the memory interface 1060. For example, the error correction component 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI express), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and/or a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 may not include the memory buffer 1020 and the buffer controller 1050. One or both of the memory buffer 1020 and memory controller 1050 may be provided separately, or one or both of their functions may be distributed to other component(s) of the memory controller 1000.

For example, the processor 1010 may control the operation of the memory controller 1000 using codes. The processor 1010 may load the codes from a non-volatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other so as not to interfere with, nor affect each other. The data bus may be connected to the host interface 1040, the buffer controller 1050, the error correction component 1030, and the memory interface 1060. The control bus may be connected to the host interface 1040, the processor 1010, the buffer controller 1050, the memory buffer 1020, and the memory interface 1060.

Figure 23:
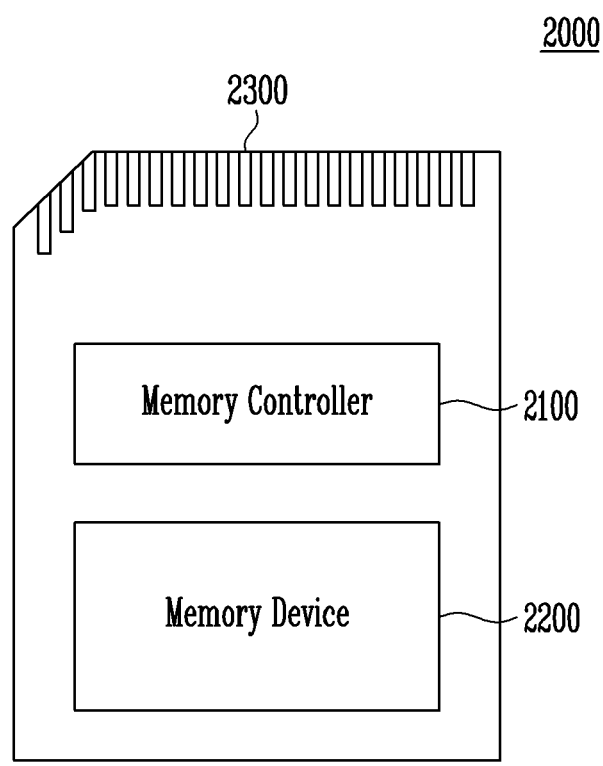
FIG. 23 is a block diagram illustrating a memory card system to which a storage device is applied according to an embodiment of the present disclosure.

FIG. 23 is a block diagram illustrating a memory card system to which the storage device is applied according to an embodiment of the present disclosure.

Referring to FIG. 23, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented with any of the memory devices described above.

As an example, the memory controller 2100 may include components such as a random access memory (RAM), a processor, a host interface, a memory interface, and an error correction component.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe. As an example, the connector 2300 may be defined by at least one of the various communication standards described above.

As an example, the memory device 2200 may be implemented as any of various non-volatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and/or a spin-torque magnetic RAM (STT-MRAM).

In an embodiment, the memory controller 2100 may receive the device information from the memory device 2200 to generate the device health descriptor DHD. The device information may include information on the number of times the program operation and the erase operation has been performed on the memory device 2200, the number of reserved blocks in the memory device 2200, and the number of times of the refresh operation has been performed on the memory device 2200.

In addition, the DHD may be configured of the plurality of fields, any one of which may indicate a first device life related to a life of the memory device 2200 determined based on the number of remaining reserved blocks in the memory device 2200.

Thereafter, the memory controller 2100 may determine whether to recycle pages in the bad block based on a value indicating the first device life in the DHD. For example, when the value indicating the first device life indicates the critical level, the memory controller 2100 may determine to recycle pages in the bad block. The critical level may be determined based on the number of remaining reserved blocks in the memory device 2200.

Furthermore, it may be determined that all pages in the bad block, except the failed page and the pages adjacent to the failed page, are recycled.

The memory controller 2100 and the memory device 2200 may be integrated into one semiconductor device to configure a memory card, such as a PC card (personal computer memory card international association (PCMCIA)), a compact flash card (CF), a smart media card (SM or SMC), a memory stick, a multimedia card (MMC, RS-MMC, MMC-micro, or eMMC), an SD card (SD, miniSD, microSD, or SDHC), and/or a universal flash storage (UFS).

Figure 24:
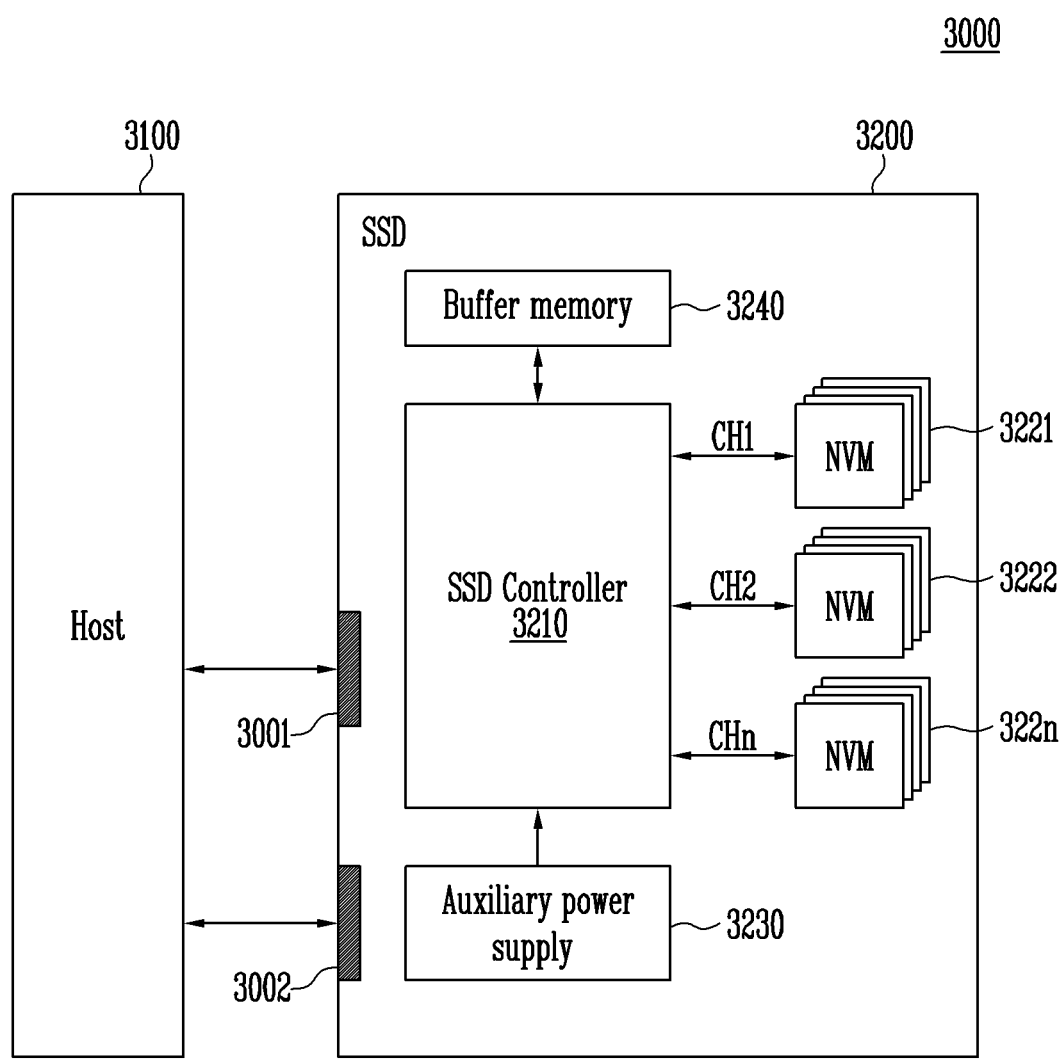
FIG. 24 is a block diagram illustrating a solid state drive (SSD) system to which a storage device is applied according to an embodiment of the present disclosure.

FIG. 24 is a block diagram illustrating a solid state drive (SSD) system to which the storage device is applied according to an embodiment of the present disclosure.

Referring to FIG. 24, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322$n$, an auxiliary power device 3230, and a buffer memory 3240.

In an embodiment, the SSD controller 3210 may perform functions of the memory controller 200 of FIG. 1.

The SSD controller 3210 may control the plurality of flash memories 3221 to 322$n$ in response to the signal SIG received from the host 3100. As an example, the signal SIG may be signals based on an interface between the host 3100 and the SSD 3200. For example, the signal SIG may be defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and/or an NVMe.

In an embodiment, the SSD controller 3210 may receive the device information from the plurality of flash memories 3221 to 322$n$ to generate the DHD. The device information may include information on the number of times the program operation and the erase operation has been performed on the plurality of flash memories 3221 to 322$n$, the number of reserved blocks in the plurality of flash memories 3221 to 322$n$, and the number of times of the refresh operation has been performed on the plurality of flash memories 3221 to 322$n$.

In addition, the DHD may be configured of a plurality of fields, any of which may indicate a first device life related to a life of the plurality of flash memories 3221 to 322$n$ determined based on the number of remaining reserved blocks in the plurality of flash memories 3221 to 322$n$.

Thereafter, the SSD controller 3210 may determine whether to recycle pages in the bad block based on a value indicating the first device life in the DHD. For example, when the value indicating the first device life indicates the critical level, the SSD controller 3210 may determine to recycle pages in the bad block. The critical level may be determined based on the number of remaining reserved blocks in the plurality of flash memories 3221 to 322n.

Furthermore, it may be determined that all pages in the bad block, except the failed page and the pages adjacent to the failed page, are recycled.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be disposed within or externally to the SSD 3200. For example, the auxiliary power device 3230 may be disposed on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a non-volatile memory such as an FRAM, a ReRAM, an STT-MRAM, and/or a PRAM.

Figure 25:
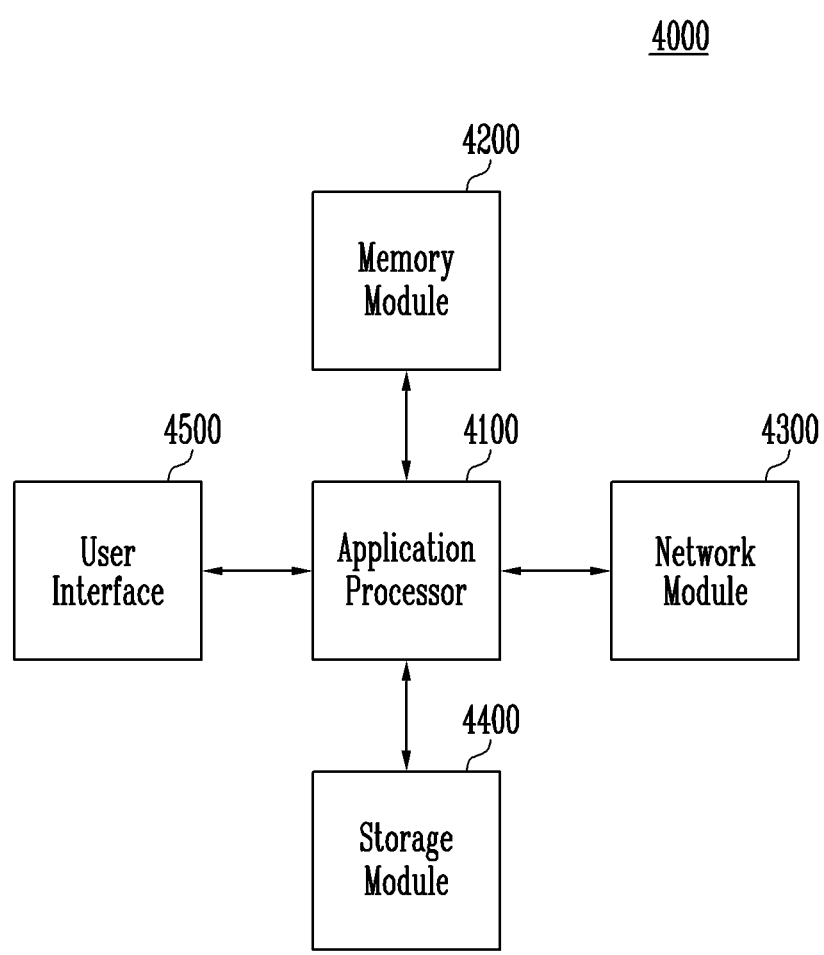
FIG. 25 is a block diagram illustrating a user system to which a storage device is applied according to an embodiment of the present disclosure.

FIG. 25 is a block diagram illustrating a user system to which the storage device is applied according to an embodiment of the present disclosure.

Referring to FIG. 25, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

In an embodiment, the application processor 4100 may receive data to be programmed in the storage module 4400 from the host 300 of FIG. 1 and store the received data. The data stored in the application processor 4100 may be output to the storage module 4400 in a stored sequence. The data output to the storage module 4400 may be stored in a page buffer of the storage module 4400.

In an embodiment, the application processor 4100 may receive the device information from the storage module 4400 to generate the device health descriptor DHD. The device information may include information on the number of times the program operation and the erase operation performed on the storage module 4400, the number of reserved blocks included in the storage module 4400, and the number of times of the refresh operation performed on the storage module 4400.

In addition, the DHD may be configured of a plurality of fields, any of which may indicate a first device life related to a life of the storage module 4400 determined based on the number of remaining reserved blocks in the storage module 4400.

Thereafter, the application processor 4100 may determine whether to recycle pages in the bad block based on a value indicating the first device life in the DHD. For example, when the value indicating the first device life indicates the critical level, the application processor 4100 may determine to recycle pages in the bad block. The critical level may be determined based on the number of remaining reserved blocks in the storage module 4400.

Furthermore, it may be determined that all pages in the bad block, except the failed page and the pages adjacent to the failed page, are recycled.

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and/or an LPDDR3 SDRAM, or a non-volatile random access memory, such as a PRAM, a ReRAM, an MRAM, and/or an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a non-volatile semiconductor memory element such as a phase-change RAM (PRAM), a magnetic RAM (MRAM), a resistive RAM (RRAM), a NAND flash, a NOR flash, and/or a three-dimensional NAND flash. For example, the storage module 4400 may be provided as a removable storage device (removable drive), such as a memory card, and an external drive of the user system 4000.

For example, the storage module 4400 may include a plurality of non-volatile memory devices, each of which may operate identically to the memory device described with reference to FIGS. 2 and 3. The storage module may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and/or a piezoelectric element. The user interface 4500 may include user output interfaces such as a liquid crystal display (LCD), an organic light emitting diode (OLED) display device, an active matrix OLED (AMOLED) display device, an LED, a speaker, and/or a monitor.

While embodiments of the present invention have been illustrated and described, various changes in configuration and operation may be made, as those skilled in the art will understand in light of the present disclosure. The present invention encompasses all such changes and variations that fall within the scope of the claims.

What is claimed is:

1. A memory controller that controls a memory device, the memory controller comprising:
   a flash translation layer configured to generate a device health descriptor based on device information received from the memory device; and
   a bad block controller configured to generate a bad block table based on bad block information received from the memory device, and generate recycling information for recycling pages in bad blocks recorded in the bad block table based on the device health descriptor,
   wherein the device health descriptor includes information related to a life of the memory device,
   wherein the information is determined based on a number of remaining reserved blocks excepted from replacing the bad blocks among reserved blocks in the memory device, and
   wherein the bad block controller generates the recycling information in response to indicating the life of the memory device as a critical level at the information.

2. The memory controller of claim 1, wherein the device health descriptor further includes at least one of information related to a size of the device health descriptor, information related to the life of the memory device determined based on program and erase operations performed on the memory device, or information related to a number of times a refresh operation is performed on the memory device.

3. The memory controller of claim 2, wherein when the bad blocks recorded in the bad block table are classified as erase fail bad blocks due to failure of the erase operations, the bad block controller generates the recycling information for the bad blocks recorded in the bad block table, except for memory blocks within a group to which the erase fail bad blocks belong.

4. The memory controller of claim 1, wherein the information related to the life of the memory device determined based on a number of reserved blocks indicates any one of a first value indicating that the life of the memory device is at a normal level state if the number of remaining reserved blocks is greater than a first threshold value, a second value indicating that the life of the memory device is at a warning level state if the number of remaining reserved blocks is greater than a second threshold value and less than the first threshold value, and a third value indicating that the life of the memory device is at a critical level state if the number of remaining reserved blocks is less than the second threshold value.

5. The memory controller of claim 4, wherein if the information related to the life of the memory device determined based on the number of reserved blocks indicates the third value, the bad block controller generates the recycling information.

6. The memory controller of claim 1, wherein the recycling information includes information on pages, except for a failed page in which an operation failed and pages adjacent to the failed page, among the pages in the bad blocks recorded in the bad block table.

7. The memory controller of claim 6, wherein the pages adjacent to the failed page includes pages of planes adjacent to a plane to which the failed page belongs.

8. The memory controller of claim 1, wherein the memory controller instructs that a program operation be performed on pages based on the recycling information.

9. A method of operating a memory controller that controls a memory device, the method comprising:
   receiving device information from the memory device;
   generating a device health descriptor including information related to a life of the memory device based on the device information; and
   determining to recycle pages in bad blocks in the memory device in response to indicating the life of the memory device as a critical level at the information,
   wherein the information is determined based on a number of remaining reserved blocks excepted from replacing the bad block among reserved blocks in the memory device.

10. The method of claim 9, wherein the device health descriptor further includes at least one of information related to a size of the device health descriptor, information related to the life of the memory device determined based on program and erase operations performed on the memory device or information related to a number of times a refresh operation is performed on the memory device.

11. The method of claim 9, wherein the information related to the life of the memory device determined based on a number of reserved blocks-indicates any one of a first value indicating that the life of the memory device has a normal level state if the number of remaining reserved blocks is greater than a first threshold value, a second value indicating that the life of the memory device has a warning level state if the number of remaining reserved blocks is greater than a second threshold value and less than the first threshold value, and a third value indicating that the life of the memory device has a critical level state if the number of remaining reserved blocks is less than a second threshold value.

12. The method of claim 11, wherein the determining whether to the recycle pages in the bad blocks in the memory device based on the device health descriptor comprises recycling pages in the bad blocks in response to the third value of the information related to the life of the memory device determined based on the number of reserved blocks.

13. The method of claim 12, further comprising:
   generating recycling information for recycling pages in the bad blocks when it is determined to recycle pages in the bad blocks.

14. The method of claim 13, wherein the generating of the recycling information includes generating information on pages, except for a failed page in which an operation failed and pages adjacent to the failed page, among the pages in the bad blocks.

15. The method of claim 13, wherein in generating the recycling information, the recycling information is generated for the bad blocks recorded in the bad block table, except for memory blocks of a group to which bad blocks due to failure of the erase operations belong.

16. The method of claim 13, further comprising: instructing that a program operation be performed on pages based on the recycling information.

* * * * *